(12) United States Patent
Fujikawa

(10) Patent No.: US 12,376,386 B2
(45) Date of Patent: Jul. 29, 2025

(54) ELECTRO-OPTICAL DEVICE AND ELECTRONIC DEVICE

(71) Applicant: SEIKO EPSON CORPORATION, Tokyo (JP)

(72) Inventor: Shinsuke Fujikawa, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 554 days.

(21) Appl. No.: 17/895,087

(22) Filed: Aug. 25, 2022

(65) Prior Publication Data

US 2023/0068144 A1 Mar. 2, 2023

(30) Foreign Application Priority Data

Aug. 27, 2021 (JP) ................................. 2021-138673

(51) Int. Cl.
  *H10D 89/60* (2025.01)
  *G01K 7/01* (2006.01)
  *H01L 21/3205* (2006.01)
  *H10D 84/00* (2025.01)
  *H10D 86/60* (2025.01)

(52) U.S. Cl.
  CPC ............. *H10D 89/911* (2025.01); *G01K 7/01* (2013.01); *H01L 21/3205* (2013.01); *H10D 84/00* (2025.01); *H10D 86/60* (2025.01); *H10D 89/611* (2025.01)

(58) Field of Classification Search
  CPC ..... H10D 89/911; H10D 84/00; H10D 86/481; H10D 86/60; H10D 89/611; G01K 7/01
  See application file for complete search history.

(56) References Cited

U.S. PATENT DOCUMENTS

| 12,222,614 B2 * | 2/2025 | Fujikawa | G02F 1/136204 |
| 2011/0038084 A1 * | 2/2011 | Lo | H02H 9/046 361/56 |
| 2016/0123817 A1 * | 5/2016 | Bennett | H10D 86/423 374/185 |
| 2016/0284446 A1 | 9/2016 | Fujikawa | |

FOREIGN PATENT DOCUMENTS

| JP | 2016184719 | 10/2016 |
| JP | 2021077665 | 5/2021 |

* cited by examiner

Primary Examiner — Jeff W Natalini
Assistant Examiner — Brandon C Fox
(74) Attorney, Agent, or Firm — JCIPRNET

(57) ABSTRACT

An electro-optical device includes a temperature detecting element and an electrostatic protection circuit configured to protect the temperature detecting element from a surge current. The electrostatic protection circuit includes a transistor electrically connected to the temperature detecting element in parallel, a first capacitance element electrically connected to the transistor, and a resistance element electrically connected to the first capacitance element in parallel. The electrostatic capacity of the first capacitance element is greater than a gate capacity between a gate electrode and a semiconductor layer that constitutes the transistor. In addition, a dielectric layer of the first capacitance element is thicker than a gate insulating film of the transistor.

13 Claims, 17 Drawing Sheets

ELECTRO-OPTICAL DEVICE AND ELECTRONIC DEVICE

The present application is based on, and claims priority from JP Application Serial Number 2021-138673, filed on Aug. 27, 2021, the disclosure of which is hereby incorporated by reference herein in its entirety.

BACKGROUND

1. Technical Field

The present disclosure relates to an electro-optical device including a temperature detecting element, and also relates to an electronic device.

2. Related Art

An electro-optical device such as a liquid crystal device includes: a first substrate including a pixel transistor and a pixel electrode at a display region; a second substrate at which a common electrode is formed so as to be opposed to the pixel electrode; and an electro-optical layer provided between the first substrate and the second substrate, and a voltage corresponding to an image signal is applied across the pixel electrode and the common electrode. In the electro-optical device configured as described above, light source light outputted from the second substrate is modulated to display an image, for example.

In a case of the electro-optical device, the response speed of the electro-optical layer changes due to an influence of a change in ambient temperatures, which may change the display performance. Thus, a technique is a proposed, in which an image signal is corrected or the like on the basis of a result of detection of temperatures by the temperature detecting element provided at the first substrate (see JP-A-2016-184719). In a case of the temperature detecting circuit described in JP-A-2016-184719, a constant current is caused to flow in the temperature detecting element while a voltage across the anode and the cathode of the temperature detecting element is being detected. The temperature detecting circuit described in JP-A-2016-184719 includes an electrostatic protection circuit including a transistor electrically connected to a temperature detecting element in parallel, and also including two capacitance elements electrically connected in serial between the anode wiring line and the cathode wiring line. A connecting node of these two capacitance elements is electrically connected to the gate electrode of the transistor. In addition, the connecting node of the two capacitance elements is electrically connected to the cathode wiring line through a resistance element. With such an electrostatic protection circuit, when a surge current due to electrostatic comes from an anode wiring line, a potential of the gate electrode increases to bring the transistor into the ON state. This makes it possible to let the surge current go into the cathode wiring line through the transistor.

With the temperature detecting circuit described in JP-A-2016-184719, when a failure occurs in each element of the electrostatic protection circuit or the temperature detecting element, temperatures cannot be appropriately detected, and the electrostatic protection circuit cannot fully achieve a predetermined protection function. Thus, in the first substrate alone or the electro-optical device, a probe is brought into contact with each of the anode terminal and the cathode terminal to apply a voltage, and an electric current is measured using a current detecting unit, thereby performing inspection as to whether or not any failure occurs in the temperature detecting circuit. Here, when an electrical breakdown happens in a capacitance element at the anode side, a short-circuited current flows at the capacitance element at the anode side, and an electric current in which the short-circuited current is added is detected. Thus, it is possible to detect a failure of the capacitance element at the anode side. However, when an electrical breakdown happens in a capacitance element at the cathode side, both electrodes of the capacitance element at the cathode side have the same potential due to a resistance element. This prevents detection of the short-circuited current at the capacitance element at the cathode side, which results in a problem in that the temperature detecting circuit cannot be appropriately inspected. In this case, an electrostatic protection circuit has the resistance element having a resistance value less than the intended value. After this, for example, the ON period of the transistor is shortened when a surge enters from the anode terminal, which prevents fulfillment of a predetermined protection function.

SUMMARY

In order to solve the problem described above, one aspect of an electro-optical device according to the present disclosure includes a temperature detecting element and an electrostatic protection circuit, the electrostatic protection circuit including a transistor including a gate electrode, a semiconductor layer, and a gate insulating film provided between the semiconductor layer and the gate electrode, the transistor being electrically connected to the temperature detecting element in parallel, the electrostatic protection circuit also including a first capacitance element including a first capacitance electrode, a second capacitance electrode, and a first dielectric layer provided between the first capacitance electrode and the second capacitance electrode, the first capacitance element being electrically connected to the transistor, and the electrostatic protection circuit also including a resistance element having one end electrically connected to the gate electrode and the first capacitance electrode and the resistance element also having another end electrically connected to a source-drain region on one side of the semiconductor layer and the second capacitance electrode, in which an electrostatic capacity of the first capacitance element is greater than an electrostatic capacity between the gate electrode and the semiconductor layer.

Another aspect of the electro-optical device according to the present disclosure includes a temperature detecting element and an electrostatic protection circuit, the electrostatic protection circuit including a transistor including a gate electrode, a semiconductor layer, and a gate insulating film provided between the semiconductor layer and the gate electrode, the transistor being electrically connected to the temperature detecting element in parallel, the electrostatic protection circuit also including a first capacitance element including a first capacitance electrode, a second capacitance electrode, and a first dielectric layer provided between the first capacitance electrode and the second capacitance electrode, the first capacitance element being electrically connected to the transistor, and the electrostatic protection circuit also including a resistance element having one end electrically connected to the gate electrode and the first capacitance electrode and the resistance element also having another end electrically connected to a source-drain region on one side of the semiconductor layer and the second capacitance electrode, in which a thickness of the first dielectric layer is greater than a thickness of the gate insulating film.

Yet another aspect of the electro-optical device according to the present disclosure includes a temperature detecting element, an electrostatic protection circuit, and a display region, the electrostatic protection circuit including a transistor including a gate electrode, a semiconductor layer, and a gate insulating film provided between the semiconductor layer and the gate electrode, the transistor being electrically connected to the temperature detecting element in parallel, the electrostatic protection circuit also including a first capacitance element including a first capacitance electrode, a second capacitance electrode, and a first dielectric layer provided between the first capacitance electrode and the second capacitance electrode, the first capacitance element being electrically connected to the transistor, and the electrostatic protection circuit also including a resistance element having one end electrically connected to the gate electrode and the first capacitance electrode and also having another end electrically connected to a source-drain region on one side of the semiconductor layer and the second capacitance electrode, the display region including a plurality of pixels arrayed therein, each of the plurality of pixels including a retention capacitor and a pixel electrode, the retention capacitor including a first electrode at a same layer as the first capacitance electrode, a second electrode at a same layer as the second capacitance electrode, a second dielectric layer at a same layer as the first dielectric layer, a third electrode electrically connected to the second electrode, a fourth electrode electrically connected to the first electrode, and a third dielectric layer provided between the third electrode and the fourth electrode.

The electro-optical device according to the present disclosure is used in an electronic device.

DESCRIPTION OF EXEMPLARY EMBODIMENTS

Figure 1:
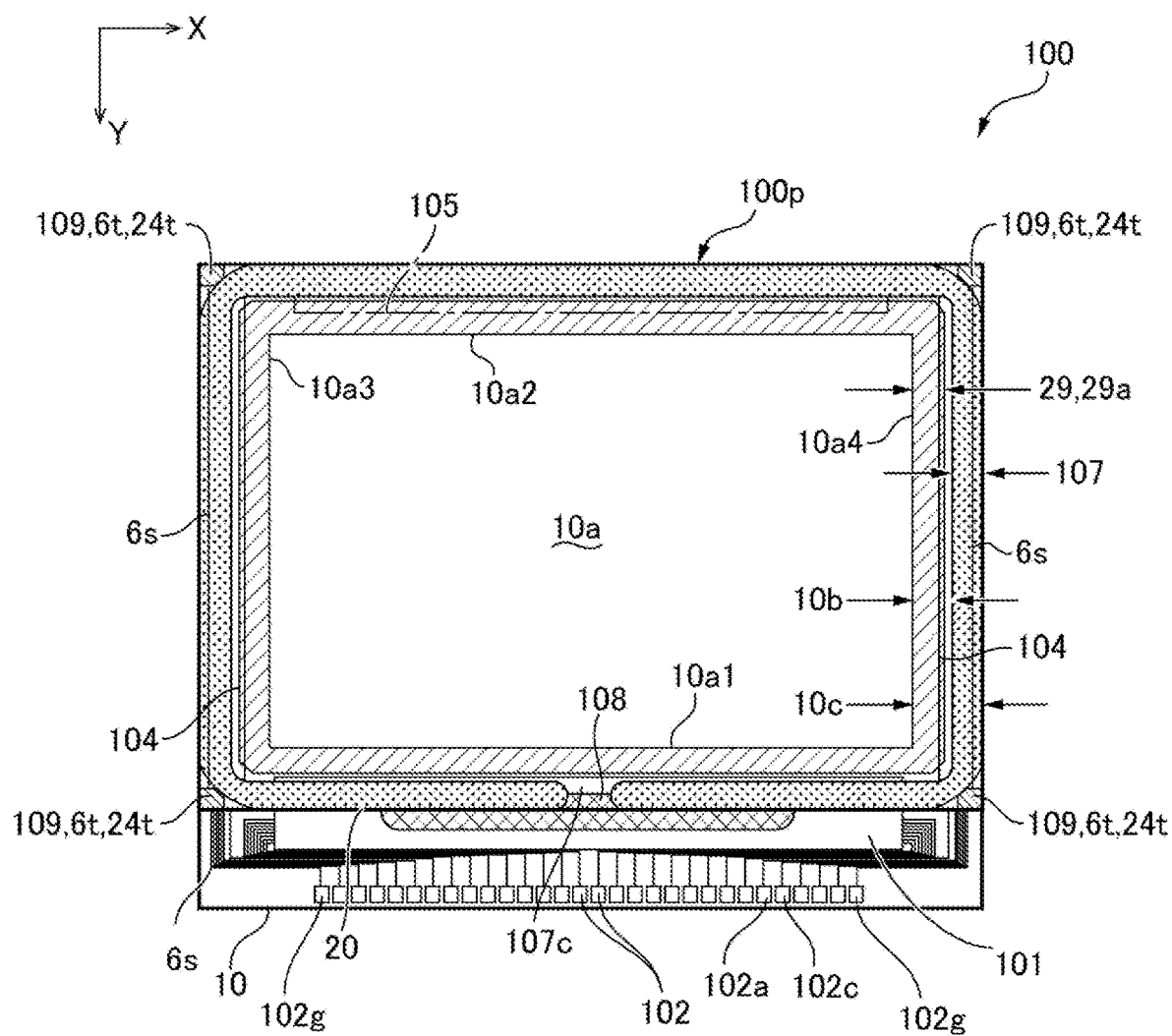
FIG. 1 is a plan view illustrating an example of a configuration of an electro-optical device according to a first embodiment of the present disclosure.

Embodiments according to the present disclosure will be described with reference to the drawings. Note that, in the drawings referred to in the description below, each layer and each member are illustrated so as to be scaled differently so that the layers and the members each have a size with which they can be recognized on the drawings. In addition, in the description of layers formed at a first substrate, an upper layer side or a front surface side means a side (a side where a counter substrate and a liquid crystal layer are disposed) opposite to a side where a substrate body of the first substrate is disposed, and a lower layer side means a side where the substrate body of the first substrate is disposed. In the description of layers formed at a second substrate, an upper layer side or a front surface side means a side (a side where the first substrate and the liquid crystal layer are disposed) opposite to a side where a substrate body of the counter substrate is disposed, and a lower layer side means a side where the substrate body of the second substrate is disposed. Furthermore, in the present disclosure, the "plan view" means a state as viewed from a normal direction with respect to a first substrate 10 or a second substrate 20.

1. EMBODIMENTS

1-1. Specific Configuration of Electro-optical Device 100

Figure 2:
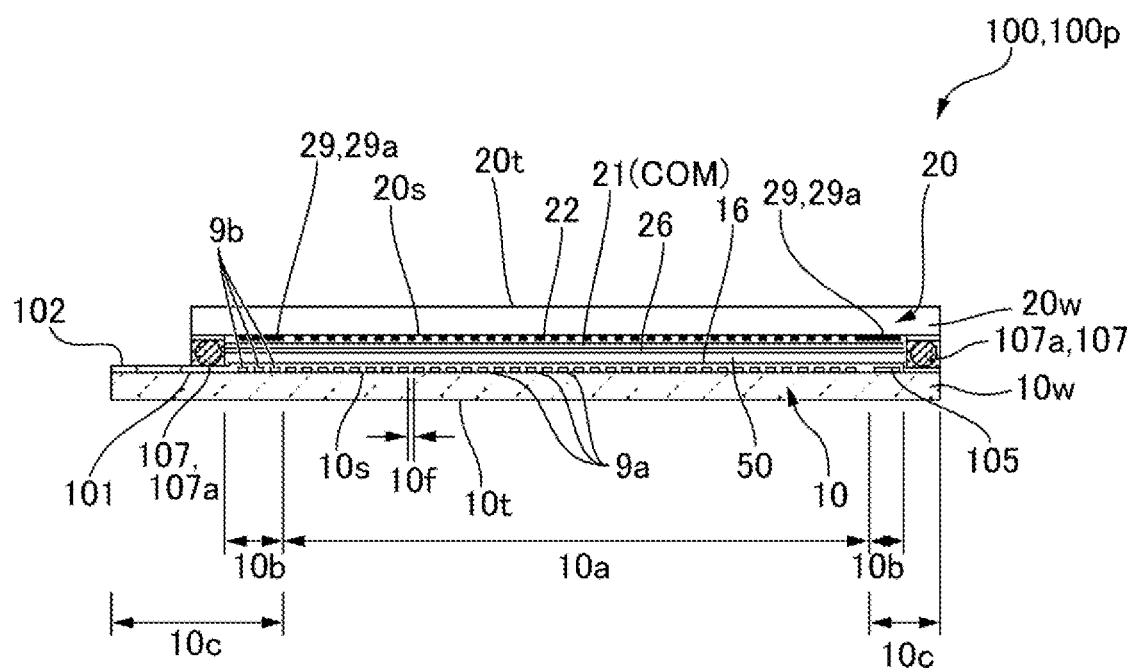
FIG. 2 is an explanatory view schematically illustrating a cross section of the electro-optical device illustrated in FIG. 1.

FIG. 1 is a plan view illustrating an example of the configuration of the electro-optical device 100 according to a first embodiment of the present disclosure. FIG. 2 is an explanatory view schematically illustrating a cross section of the electro-optical device 100 illustrated in FIG. 1. The electro-optical device 100 illustrated in FIGS. 1 and 2 is a liquid crystal device, and includes a liquid crystal panel 100p. In the electro-optical device 100, the first substrate 10 and the second substrate 20 are affixed with a seal material 107 with a predetermined space being given therebetween. The seal material 107 is provided in a frame shape so as to be along the outer edge of the second substrate 20. The seal material 107 is an adhesive made of photocurable resin, thermosetting resin, or the like, and is mixed with a gap material 107a made of glass fiber, glass beads, or the like in order to make the distance between the substrates have a predetermined value. In the electro-optical device 100, an electro-optical layer 50 comprised of a liquid crystal layer is provided in a region disposed between the first substrate 10 and the second substrate 20 and surrounded by the seal material 107. A cut portion 107c is formed at the seal material 107, and is used as an inlet for inputting liquid crystal. This cut portion 107c is closed with a sealing material 108 after a liquid crystal material is injected. Note that, when the liquid crystal material is inputted through a dropping method, the cut portion 107c is not formed. The first substrate 10 and the second substrate 20 each have a quadrilateral shape. A display region 10a is formed as a quadrilateral region at a substantially center of the electro-optical device 100. In response to this shape, the seal material 107 is provided so as to have a substantially quadrilateral shape. The outer side of the display region 10a constitutes an outer-peripheral region 10c having a quadrilateral frame shape.

In the display region 10a, two sides extending in a first direction X are set as a first side 10a1 and a second side 10a2, and two sides extending in a second direction Y are set as a third side 10a3 and a fourth side 10a4. With these settings, the outer-peripheral region 10c of the first substrate 10 includes a data line driving circuit 101 provided between an end portion of the first substrate 10 and the first side 10a1 of the display region 10a, and also includes a pre-charge circuit 105 provided between an end portion of the first substrate 10 and the second side 10a2 of the display region 10a. In addition, a scanning line drive circuit 104 is provided between the end portion of the first substrate 10 and the third side 10a3 of the display region 10a and between the end portion of the first substrate 10 and a fourth side 10a4 of the display region 10a.

The first substrate 10 includes a light-transmitting substrate body 10w such as a quartz substrate or a glass substrate. In the display region 10a, a plurality of pixel transistors and a pixel electrode 9a electrically connected to each of the plurality of pixel transistors are formed in a matrix manner at a side of a one-side surface 10s of the first substrate 10 that is opposed to the second substrate 20. A first alignment film 16 is formed at the upper layer side of the pixel electrode 9a. At the side of the one-side surface 10s of the first substrate 10, a dummy pixel electrode 9b, which has been formed at the same time as the pixel electrode 9a, is formed in a portion of a frame-shape region 10b having a quadrilateral shape and extending between the outer edge of the display region 10a and the seal material 107, this portion extending along each side of the display region 10a. Note that a reference character "10t" is attached to a surface of the first substrate 10 that is disposed at an opposite side from the one-side surface 10s that is opposed to the second substrate 20.

The second substrate 20 includes a light-transmitting substrate body 20w such as a quartz substrate or a glass substrate. A common electrode 21 is formed at a side of a one-side surface 20s of the second substrate 20 that is opposed to the first substrate 10. The common electrode 21 is formed over substantially the entire surface of the one-side surface 20s side of the second substrate 20. At the one-side surface 20s side of the second substrate 20, a light shielding layer 29 is formed in the frame-shape region 10b and at the lower layer side of the common electrode 21. A second alignment film 26 is stacked at the front surface of the common electrode 21. A transmissive flattening layer 22 is formed between the light shielding layer 29 and the common electrode 21. The light shielding layer 29 is formed as a parting 29a extending along the frame-shape region 10b. The inner edge of the parting 29a defines the display region 10a. The light shielding layer 29 may be formed as a black matrix portion that overlaps with an inter-pixel region 10f disposed between adjacent pixel electrodes 9a. The parting 29a is formed at a position that overlaps with the dummy pixel electrode 9b in plan view. The light shielding layer 29 is made out of a metal film or black resin having a light shielding property. Note that a reference character "20t" is attached to a surface of the second substrate 20 that is disposed at an opposite side from the one-side surface 20s that is opposed to the first substrate 10.

The first alignment film 16 and the second alignment film 26 are inorganic alignment films each comprised of a diagonally vapor-deposited film made of $SiO_x$ ($x \leq 2$), $TiO_2$, MgO, $Al_2O_3$, or the like, and are each comprised of a columnar structure layer in which a pillar-shaped body called a column is formed diagonally relative to the first substrate 10 and the second substrate 20. Thus, the first alignment film 16 and the second alignment film 26 are configured such that nematic liquid crystal molecules having negative dielectric anisotropy used in the electro-optical layer 50 are aligned diagonally with respect to the first substrate 10 and the second substrate 20, and pre-tilt is applied to the liquid crystal molecules. In this manner, the electro-optical device 100 is configured as a liquid crystal device having a vertical alignment (VA) mode of normally black.

At an outer side of the first substrate 10 than the seal material 107, an inter-substrate conduction electrode portion 6t is formed at portions that overlap with four corner portions 24t of the second substrate 20. The inter-substrate conduction electrode portion 6t is electrically continuous with a common potential line 6s. The common potential line 6s is electrically continuous with a terminal 102g for application of a common potential COM of the terminal 102. An inter-substrate conduction material 109 containing electrically conductive particles is disposed between the inter-substrate conduction electrode portion 6t and the corner portion 24t. The common electrode 21 of the second substrate 20 is electrically connected to the first substrate 10 side through the inter-substrate conduction electrode portion 6t and the inter-substrate conduction material 109. With this configuration, the common potential COM is applied to the common electrode 21 from the first substrate 10 side. Note that, in addition to the terminal 102g for application of the common potential, the terminal 102 includes a cathode terminal 102c electrically connected to a cathode wiring line of a temperature detecting circuit that will be described later, and also includes an anode terminal 102a electrically connected to an anode wiring line of the temperature detecting circuit.

The electro-optical device 100 according to the present embodiment is a transmissive-type liquid crystal device. Thus, the pixel electrode 9a and the common electrode 21 are each made of a transmissive electrically conducting film such as an indium tin oxide (ITO) film or an indium zinc oxide (IZO) film. In such a transmissive-type liquid crystal device, for example, light source light enters from the second substrate 20 side, and is modulated until it is outputted from the first substrate 10, and an image is displayed.

The electro-optical device 100 can be used as a color display device in an electronic device such as a mobile computer or a mobile cell phone. In this case, a color filter (not illustrated) is formed at the second substrate 20 or the first substrate 10. In addition, the electro-optical device 100 can be used as a light valve for RGB in a projection-type display device that will be described later. In this case, light of each color that has been separated through a dichroic mirror for RGB color separation enters a corresponding RGB electro-optical device 100 as projection light. Thus, no color filter is formed.

1-2. Electrical Configuration of Electro-Optical Device 100

Figure 3:
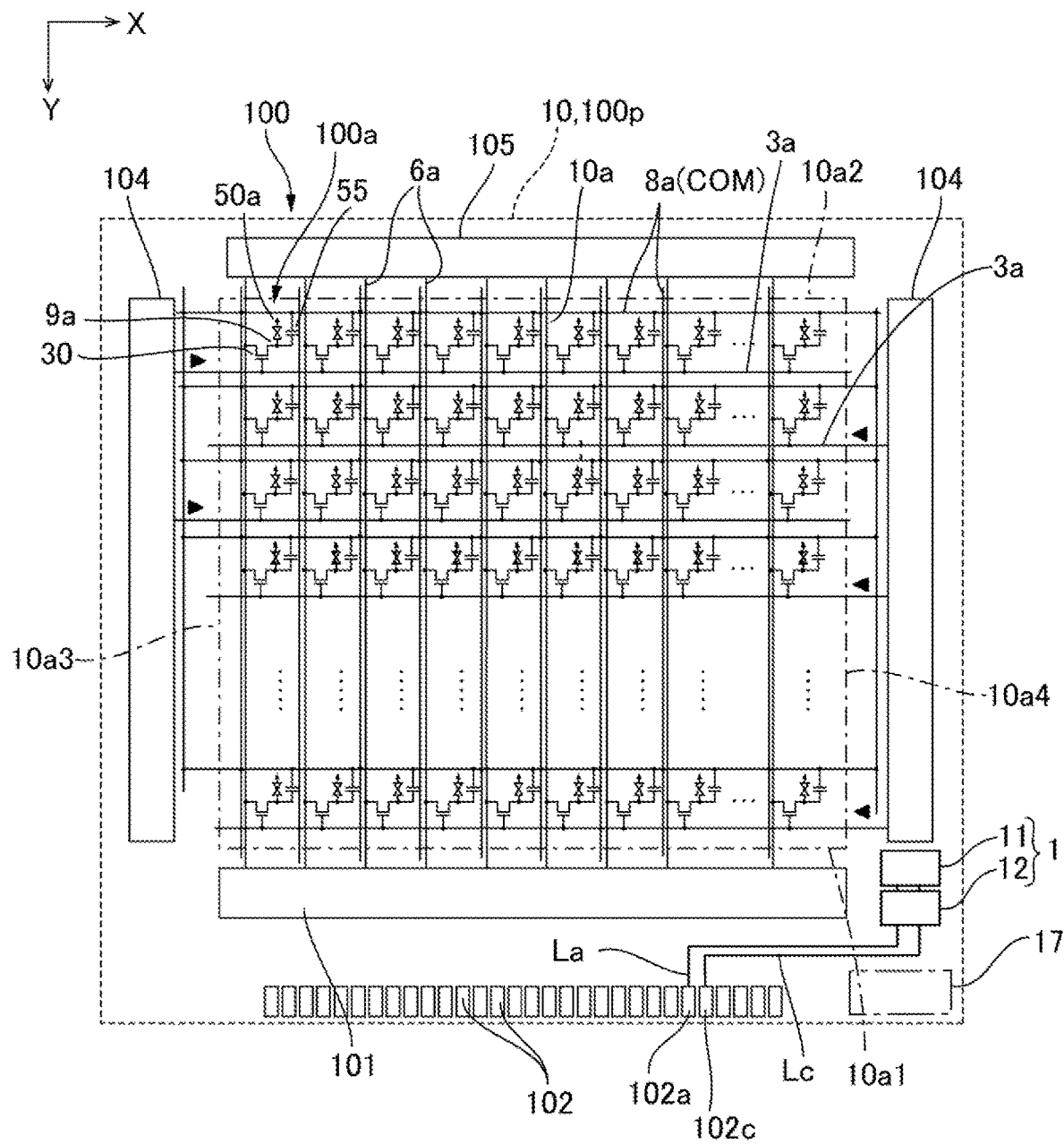
FIG. 3 is a circuit block diagram illustrating an electrical configuration of the electro-optical device illustrated in FIG. 1.

FIG. 3 is a circuit block diagram illustrating an electrical configuration of the electro-optical device 100 illustrated in FIG. 1. In FIG. 3, the electro-optical device 100 includes a liquid crystal panel 100p with a VA mode. The liquid crystal panel 100p includes, at the center region thereof, a display region 10a in which a plurality of pixels 100a are arrayed in a matrix manner. In the liquid crystal panel 100p, the first substrate 10 that has been described with reference to FIGS. 1 and 2 includes, inside of the display region 10a, a plurality of scanning lines 3a extending in a first direction X from the scanning line drive circuit 104 and a plurality of data lines 6a extending in the second direction Y from the data line driving circuit 101. The pixels 100a are configured so as to correspond to intersections of the scanning lines 3a and the data lines 6a. The plurality of data lines 6a are electrically connected to the pre-charge circuit 105 disposed at the second side 10a2 side of the display region 10a. Each of the plurality of pixels 100a includes a pixel transistor 30 comprised of a field-effect type transistor or the like, and a pixel electrode 9a electrically connected to the pixel transistor 30. The source of the pixel transistor 30 is electrically connected to the data line 6a. The gate of the pixel transistor 30 is electrically connected to the scanning line 3a. The drain of the pixel transistor 30 is electrically connected to the pixel electrode 9a. The data line 6a is supplied with an image signal. The scanning line 3a is supplied with a scanning signal.

In each of the pixels 100a, the pixel electrode 9a is opposed to the common electrode 21 of the second substrate 20 that has been described with reference to FIG. 2 with the electro-optical layer 50 being interposed therebetween, and constitutes a liquid crystal capacitor 50a. Each of the pixels 100a includes a retention capacitor 55 added in parallel to the liquid crystal capacitor 50a in order to prevent an image signal held in the liquid crystal capacitor from changing. In the present embodiment, in order to configure the retention capacitor 55, a capacitance line 8a extending over the plurality of pixels 100a is formed at the first substrate 10. The capacitance line 8a is supplied with the common potential COM. The capacitance line 8a is provided so as to overlap with at least one of the scanning line 3a and the data line 6a. FIG. 3 illustrates, as an example, a mode in which the capacitance line 8a overlaps with both the scanning line 3a and the data line 6a. Although illustration is not given, the capacitance line 8a is electrically connected to the common potential line 6s described with reference to FIG. 1. In addition, FIG. 3 illustrates a configuration in which scanning lines 3a in odd rows are driven by the scanning line drive circuit 104 disposed at the left of the display region 10a and scanning lines 3a in even rows are driven by the scanning line drive circuit 104 disposed at the right of the display region 10a. However, it may be possible to employ a configuration in which the same scanning line 3a is driven by the left and right scanning line drive circuits 104.

In the first substrate 10, a temperature detecting circuit 1 that will be described later with reference to FIG. 5 or the like is configured at the outside of the display region 10a. Furthermore, in the first substrate 10, an inspection area 17 used to inspect an electrical property of an element that constitutes the temperature detecting circuit 1 or the like may be provided at the outside of the display region 10a.

1-3. Specific Configuration of Pixel 100a

Figure 4:
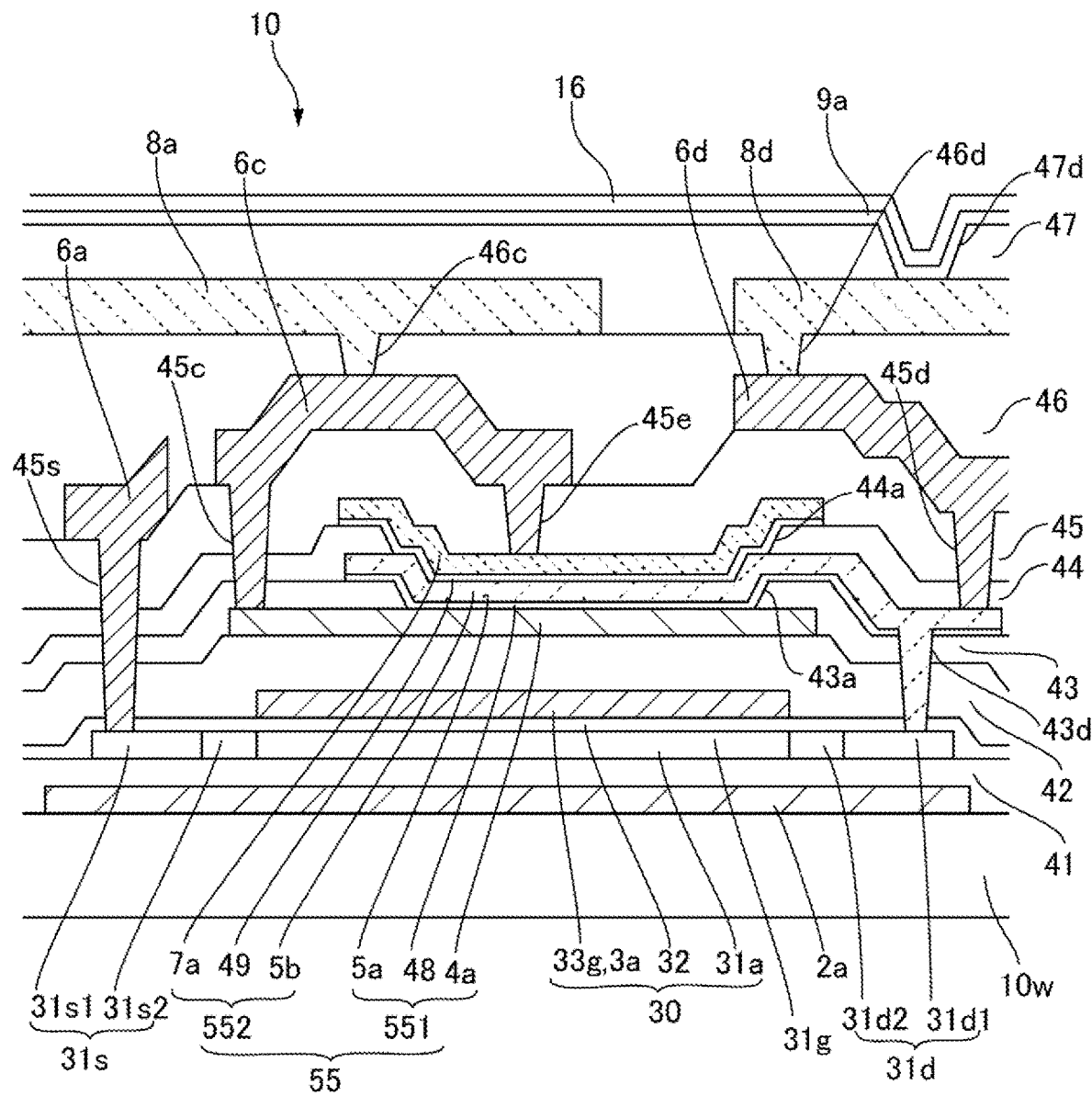
FIG. 4 is a cross-sectional view schematically illustrating an example of a configuration of pixels of the electro-optical device illustrated in FIG. 1.

FIG. 4 is a cross-sectional view schematically illustrating an example of the configuration of the pixel 100a of the electro-optical device 100 illustrated in FIG. 1. As illustrated in FIG. 4, a light shielding layer 2a at the lower layer side comprised of an electrically conducting film such as a metal silicide film, a metal film, or a metallic compound film is formed at the first substrate 10. The light shielding layer 2a is formed so as to be along the scanning line 3a. In the present mode, the light shielding layer 2a is comprised of a light shielding film made of tungsten silicide (WSi) or the like. A light-transmitting insulating film 41 comprised of a silicon oxide film or the like is formed at the upper layer side of the light shielding layer 2a. The pixel transistor 30 including a semiconductor layer 31a is formed at the front surface side of the insulating film 41. The light shielding layer 2a is configured to prevent feedback light or the like entering from the substrate body 10w side from entering the pixel transistor 30.

The pixel transistor 30 includes a semiconductor layer 31a and a gate electrode 33g comprised of a portion of the scanning line 3a intersecting the semiconductor layer 31a, and also includes a transmissive gate insulating film 32 comprised of a silicon oxide film or the like and disposed between the semiconductor layer 31a and the gate electrode 33g. The thickness of the gate insulating film 32 falls, for example, in a range of 80 nm to 100 nm. The semiconductor layer 31a is comprised of a polysilicon film or the like. The pixel transistor 30 has a lightly doped drain (LDD) structure. More specifically, in the pixel transistor 30, a source region 31s includes a high density region 31s1 spaced apart from the channel region 31g and a low density region 31s2 interposed between a channel region 31g and the high density region 31s1. A drain region 31d includes a high density region 31d1 spaced apart from the channel region 31g, and a low density region 31d2 interposed between the channel region 31g and the high density region 31d1. Note that it may be possible to employ a configuration in which the light shielding layer 2a is used as the scanning line 3a, and the gate electrode 33g is electrically connected to the light shielding layer 2a through a contact hole (not illustrated) extending through the gate insulating film 32 and the insulating film 41.

Light-transmitting insulating films 42, 43, 44, 45, 46, and 47 each comprised of a silicon oxide film or the like are stacked sequentially at the upper layer side of the gate electrode 33g. By using spaces between the insulating films 42, 43, 44, 45, the retention capacitor 55, which has been described with reference to FIG. 3, is configured. In the present mode, the retention capacitor 55 includes a first retention capacitor 551 configured between the insulating film 42 and the insulating film 44, and a second retention capacitor 552 configured between the insulating film 43 and the insulating film 45. The first retention capacitor 551 and the second retention capacitor 552 are electrically connected in parallel.

More specifically, a first electrode 4a is formed between layers of the insulating film 42 and the insulating film 43. In the insulating film 43, an opening portion 43a is formed by removing part of a portion of the film that overlaps with the first electrode 4a in plan view. A portion of the first electrode 4a is exposed from the insulating film 43 at the bottom of the opening portion 43a. The insulating film 48 and the second electrode 5a are stacked sequentially between layers of the insulating film 43 and the insulating film 44. At the bottom of the opening portion 43a, the first electrode 4a and the second electrode 5a overlap with each other in plan view with the insulating film 48 being interposed therebetween. Thus, the first electrode 4a and the second electrode 5a constitute the first retention capacitor 551 with the insulating film 48 being used as a dielectric film. Note that the insulating film 43 protects the first electrode 4a when patterning of the second electrode 5a and the insulating film 48 is performed. Thus, in the outside of the opening portion 43a, the first electrode 4a and the second electrode 5a overlap with each other with the insulating films 43 and 48 being interposed therebetween, whereas, in the inside of the opening portion 43a, they overlap with each other with only the insulating film 48 being interposed therebetween. With this configuration, a portion where the first electrode 4a and the second electrode 5a overlap with each other in the outside of the opening portion 43a only occupies a small portion of the electrostatic capacity of the first retention capacitor 551.

A third electrode 5b is formed between layers of the insulating film 43 and the insulating film 44. In the present mode, the second electrode 5a and the third electrode 5b are comprised of the same electrically conducting film. Thus, in the present mode, the second electrode 5a and the third electrode 5b are the same electrode. In the insulating film 44, an opening portion 44a is formed by removing part of a portion of the film that overlaps with the third electrode 5b (second electrode 5a) in plan view. A portion of the third electrode 5b (second electrode 5a) is exposed from the insulating film 44 at the bottom of the opening portion 44a. The insulating film 49 and the fourth electrode 7a are stacked sequentially between layers of the insulating film 44 and the insulating film 45. At the bottom of the opening portion 44a, the third electrode 5b (second electrode 5a) and the fourth electrode 7a overlap with each other in plan view with the insulating film 49 being interposed therebetween. Thus, the third electrode 5b (second electrode 5a) and the fourth electrode 7a constitute a second retention capacitor 552 with the insulating film 49 being used as a dielectric film. Note that the insulating film 44 protects the third electrode 5b (second electrode 5a) when patterning of the fourth electrode 7a and the insulating film 49 is performed. Thus, the third electrode 5b (second electrode 5a) and the fourth electrode 7a overlap with each other in the outside of the opening portion 44a with the insulating films 44 and 49 being interposed therebetween, whereas, in the inside of the opening portion 44a, they overlap with each other with only the insulating film 49 being interposed therebetween. With this configuration, a portion where the third electrode 5b (second electrode 5a) and the fourth electrode 7a overlap with each other in the outside of the opening portion 44a only occupies a small portion of the electrostatic capacity of the second retention capacitor 552.

In the present mode, the first electrode 4a is, for example, an electrically conductive polysilicon film, and the thickness of the first electrode 4a is, for example, 100 nm. The insulating film 43 is, for example, a silicon oxide film, and the film thickness of the insulating film 43 is, for example, equal to or more than 100 nm. For example, the insulating film 48 is made of silicon oxide or silicon nitride, or is comprised of a stacked film thereof. When the insulating film 48 is made of silicon oxide, the thickness of the insulating film 48 is, for example, 100 nm. By making the insulating film 48 out of silicon nitride, the relative dielectric constant is large, and hence, it is possible to increase the electrostatic capacity of the first retention capacitor 551, as compared with a case where the insulating film 48 is made of silicon oxide. The electrically conducting film that constitutes the second electrode 5a (third electrode 5b) is, for example, an electrically conductive polysilicon, and the thickness of the electrically conducting film is, for example, 100 nm. The insulating film 44 is made, for example, of a silicon oxide film, and the film thickness of the insulating film 44 is, for example, equal to or more than 100 nm. For example, the insulating film 49 is made of silicon oxide or silicon nitride, or is comprised of a stacked film thereof. When the insulating film 49 is made of silicon oxide, the thickness of the insulating film 49 is, for example, 100 nm. By making the insulating film 49 out of silicon nitride, the relative dielectric constant is large, and hence, it is possible to increase the electrostatic capacity of the second retention capacitor 552, as compared with a case where the insulating film 49 is made of silicon oxide. The fourth electrode 7a is made, for example, of tungsten silicide, and the film thickness of the fourth electrode 7a is, for example, 150 nm. The fourth electrode 7a also functions as a light shielding film configured to prevent light from entering the pixel transistor 30 from the pixel electrode 9a side.

In the first retention capacitor 551 and the second retention capacitor 552 having such a configuration, the electrically conducting film that constitutes the third electrode 5b (second electrode 5a) is electrically connected to the drain region 31d of the pixel transistor 30 through a contact hole 43d extending through the gate insulating film 32 and the insulating films 42 and 43. In addition, a relay electrode 6c formed between layers of the insulating film 45 and the insulating film 46 is electrically connected to the first electrode 4a through a contact hole 45c extending through the insulating films 43, 44, and 45, and is also electrically connected to the fourth electrode 7a through a contact hole 45e extending through the insulating film 45. Thus, the retention capacitor 55 in which the first retention capacitor 551 and the second retention capacitor 552 are electrically connected to each other in parallel is configured between the relay electrode 6c and the electrically conducting film that constitutes the third electrode 5b (second electrode 5a).

The data line 6a is formed between layers of the insulating film 45 and the insulating film 46. The data line 6a is electrically connected to the source region 31s of the pixel transistor 30 through a contact hole 45s extending through the gate insulating film 32 and the insulating films 42, 43, 44, and 45. In addition, a relay electrode 6d is formed between layers of the insulating film 45 and the insulating film 46. The relay electrode 6d is electrically connected, through a contact hole 45d extending through the insulating films 44 and 45, to the electrically conducting film that constitutes the third electrode 5b (second electrode 5a).

The capacitance line 8a and a relay electrode 8d are formed between layers of the insulating film 46 and an insulating film 47. The capacitance line 8a is electrically connected to the relay electrode 6c through a contact hole 46c extending through the insulating film 46. The relay electrode 8d is electrically connected to the relay electrode 6d through a contact hole 46d extending through the insulating film 46. The front surface of the insulating film 46 is flattened through a chemical mechanical polishing (CMP) or the like.

The pixel electrode 9a is formed at an upper layer of the insulating film 47. The pixel electrode 9a is electrically connected to the relay electrode 8d through a contact hole 47d extending through the insulating film 47. Thus, the pixel electrode 9a is electrically connected to the electrically conducting film that constitutes the third electrode 5b (second electrode 5a), and is also electrically connected to the drain region 31d of the pixel transistor 30.

1-4. Configuration of Temperature Detecting Circuit 1

Figure 5:
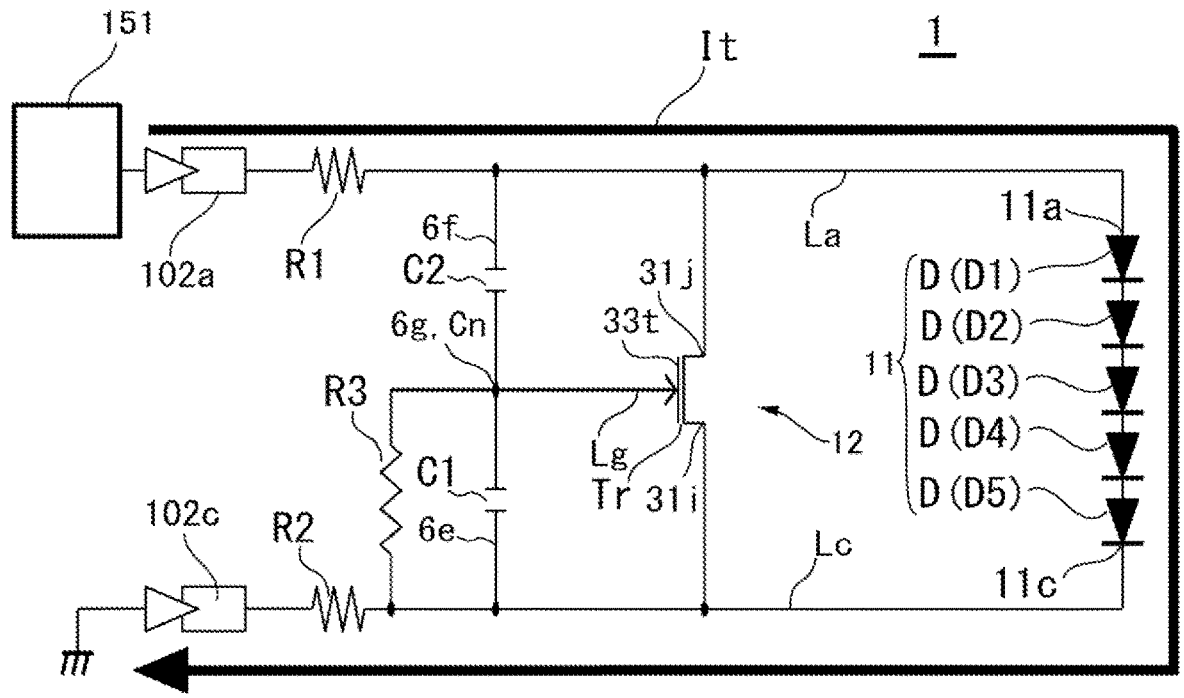
FIG. 5 is an explanatory view of a temperature detecting circuit of the electro-optical device illustrated in FIG. 1.
Figure 6:
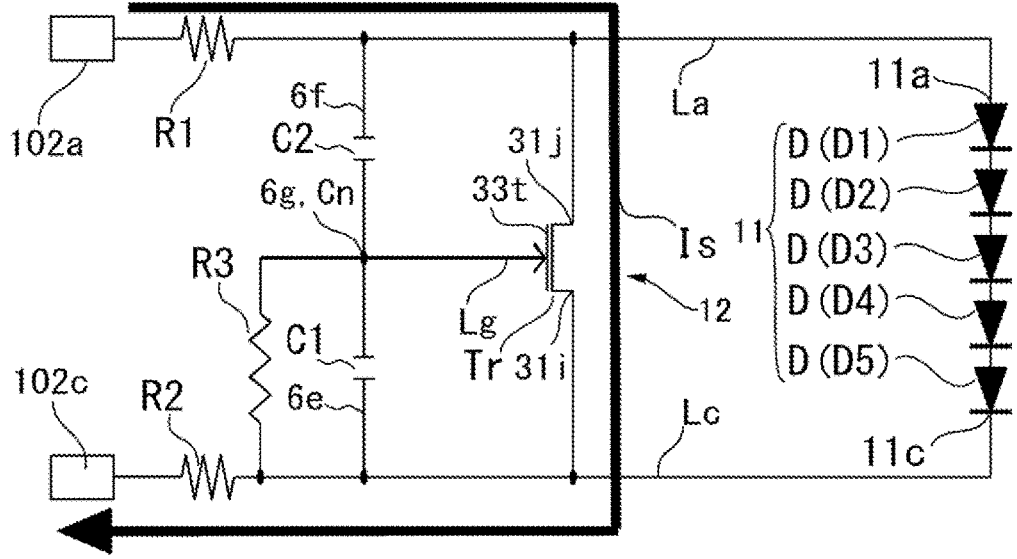
FIG. 6 is an explanatory view in a case where a surge current enters the temperature detecting circuit illustrated in FIG. 5.

FIG. 5 is an explanatory view illustrating the temperature detecting circuit 1 of the electro-optical device 100 illustrated in FIG. 1. FIG. 5 illustrates a state of detecting temperatures by the temperature detecting circuit 1. FIG. 6 is an explanatory view illustrating a case where a surge current enters the temperature detecting circuit 1 illustrated in FIG. 5.

As illustrated in FIG. 3, in the first substrate 10 of the electro-optical device 100 according to the present mode, the temperature detecting circuit 1 configured to detect temperatures of the liquid crystal panel 100p is provided at the outside of the display region 10a. In the present mode, the temperature detecting circuit 1 is provided in a region adjacent to the data line driving circuit 101 in the first direction X and also adjacent to the scanning line drive circuit 104 in the second direction Y. The temperature detecting circuit 1 includes a temperature detecting element 11 and an electrostatic protection circuit 12 used to protect the temperature detecting element 11 from a surge current. In the first substrate 10, the temperature detecting element 11 is disposed near the display region 10a. In addition, the electrostatic protection circuit 12 is provided between the temperature detecting element 11 and an end portion of the first substrate 10 where the terminal 102 is arrayed.

As illustrated in FIG. 5, the temperature detecting element 11 includes, for example, a plurality of diode elements D connected in series. FIG. 5 illustrates, as an example, a mode in which five diode elements D1 to D5 are electrically connected in series. With such a temperature detecting element 11, it is possible to set the sensitivity of the forward voltage of the temperature detecting element 11 relative to temperatures to be approximately −10 mV/° C. when a constant electric current is caused to flow. An anode wiring line La extending from the anode terminal 102a is electrically connected to an anode 11a of the diode element D1 of the temperature detecting element 11. A cathode wiring line Lc extending from the cathode terminal 102c is electrically connected to a cathode 11c of the diode element D5 of the temperature detecting element 11.

Thus, in a state where the electro-optical device 100 is mounted at the electronic device, a small driving current It in a forward direction that falls in a range of approximately 10 nA to several μA is supplied to the temperature detecting element 11 of the temperature detecting circuit 1 through the anode terminal 102a and the cathode terminal 102c from a driving circuit 151 for detecting temperatures through a flexible wiring substrate (not illustrated) connected to the first substrate 10. Here, the voltage in the forward direction of the temperature detecting element 11 comprised of five diode elements D1 to D5 changes relative to temperatures in a substantially linear manner. Thus, by detecting the voltage across the anode terminal 102a and the cathode terminal 102c, it is possible to detect temperatures of the liquid crystal panel 100p. At this time, the temperature detecting element 11 is disposed near the display region 10a. This enables the temperature detecting element 11 to appropriately detect temperatures of the display region 10a. Thus, by correcting an image signal on the basis of detection of temperatures of the temperature detecting circuit 1, it is possible to drive the electro-optical device 100 under appropriate conditions corresponding to the temperature of the display region 10a, which makes it possible to display high quality images.

In the present mode, the electrostatic protection circuit 12 includes a transistor Tr connected between the anode wiring line La and the cathode wiring line Lc. The transistor Tr is electrically connected to the temperature detecting element 11 in parallel. A one-side source-drain region 31i of the transistor Tr is connected to the cathode wiring line Lc between the cathode terminal 102c and the cathode 11c of the diode element D5 of the temperature detecting element 11. Another-side source-drain region 31j of the transistor Tr is connected to the anode wiring line La between the anode terminal 102a and an anode 11a of the diode element D1 of the temperature detecting element 11. In the present mode, the transistor Tr is comprised of an N-channel type thin film transistor, as with the pixel transistor 30.

In the electrostatic protection circuit 12, the first capacitance element C1 and the second capacitance element C2 are connected to each other in series, and are electrically connected between the anode wiring line La and the cathode wiring line Lc. More specifically, one end of the first capacitance element C1 is electrically connected to the cathode wiring line Lc. One end of the second capacitance element C2 is electrically connected to the anode wiring line La. The other end of the first capacitance element C1 and the other end of the second capacitance element C2 are electrically connected to each other. Thus, the first capacitance element C1 and the second capacitance element C2 are electrically connected to each other in series between the anode wiring line La and the cathode wiring line Lc.

In addition, a second resistance element R2 is interposed between the cathode terminal 102c and the connecting position between the cathode wiring line Lc and the first capacitance element C1. A first resistance element R1 is interposed between the anode terminal 102a and the connecting position between the anode wiring line La and the second capacitance element C2. Furthermore, the connecting node Cn between the first capacitance element C1 and the second capacitance element C2 is electrically connected to a gate electrode 33t of the transistor Tr.

The electrostatic protection circuit 12 includes a resistance element R3 electrically connected to the first capacitance element C1 in parallel. More specifically, the gate wiring line Lg extending from the gate electrode 33t of the transistor Tr is electrically connected to the connecting node Cn between the first capacitance element C1 and the second capacitance element C2, and is electrically connected to the cathode wiring line Lc through the resistance element R3.

Thus, the electrostatic protection circuit 12 includes the transistor Tr electrically connected to the temperature detecting element 11 in parallel, the first capacitance element C1 electrically connected to the transistor Tr, and the resistance element R3 electrically connected to the first capacitance element C1 in parallel. In addition, the electrostatic protection circuit 12 includes the second capacitance element C2 electrically connected to the first capacitance element C1 in series. Thus, when a surge current due to electrostatic enters from the anode terminal 102a, the electrostatic protection circuit 12 protects the temperature detecting element 11 from the electrostatic. More specifically, in the electrostatic protection circuit 12, in a static state, a voltage across the gate and source of the transistor Tr is 0 V, and the transistor Tr is OFF. In contrast, when a surge current Is due to electrostatic enters from the anode terminal 102a as illustrated in FIG. 6, a change in voltage is suppressed by the first resistance element R1, and at the same time, a potential of the gate electrode 33t of the transistor Tr that is a potential of the connecting node Cn between the first capacitance element C1 and the second capacitance element C2 increases. This brings the transistor Tr into the ON state, resulting in the surge current Is flowing through the transistor Tr and the cathode wiring line Lc into the cathode terminal 102c. At this time, the first resistance element R1 alleviates the surge current Is entering from the anode terminal 102a, and the second resistance element R2 alleviates the surge current Is entering from the cathode terminal 102c. In addition, the period in which the transistor Tr is ON is determined depending on the first capacitance element C1, the second capacitance element C2, the resistance element R3, the gate capacity of the transistor Tr, and the like. After discharge, the voltage across the gate and source of the transistor Tr returns to 0 V with the resistance element R3. Thus, the surge current Is flowing through the temperature detecting element 11 is suppressed by the electrostatic protection circuit 12, which makes it possible to protect the temperature detecting element 11. Note that, in FIG. 5, the first resistance element R1 and the second resistance element R2 cause a reduction in the voltage due to the driving current It of the temperature detecting element 11. However, the driving current It is significantly small, and hence, it is possible to almost neglect the influence of the reduction in the voltage due to the first resistance element R1 and the second resistance element R2.

1-5. Specific Configuration of Temperature Detecting Element 11

Figure 7:
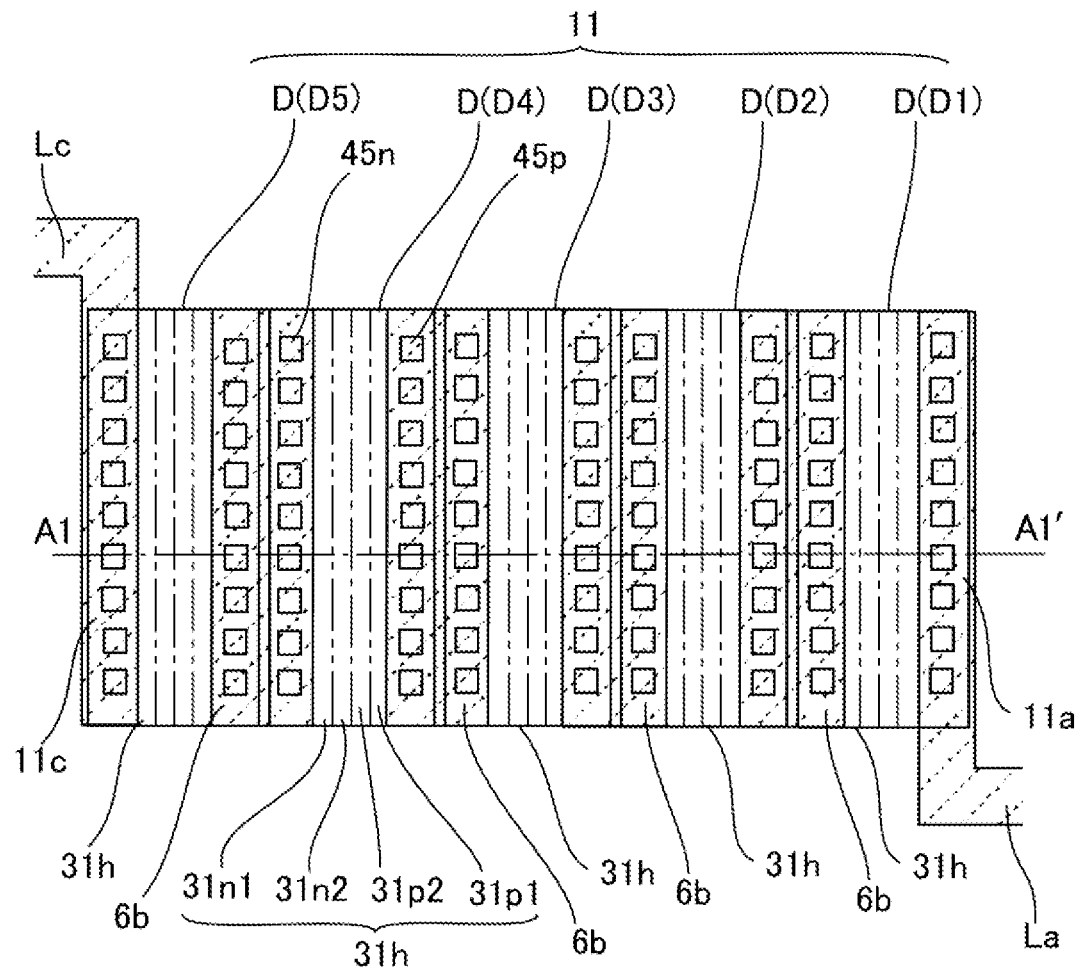
FIG. 7 is a plan view schematically illustrating a planar configuration of the temperature detecting element illustrated in FIG. 5.
Figure 8:
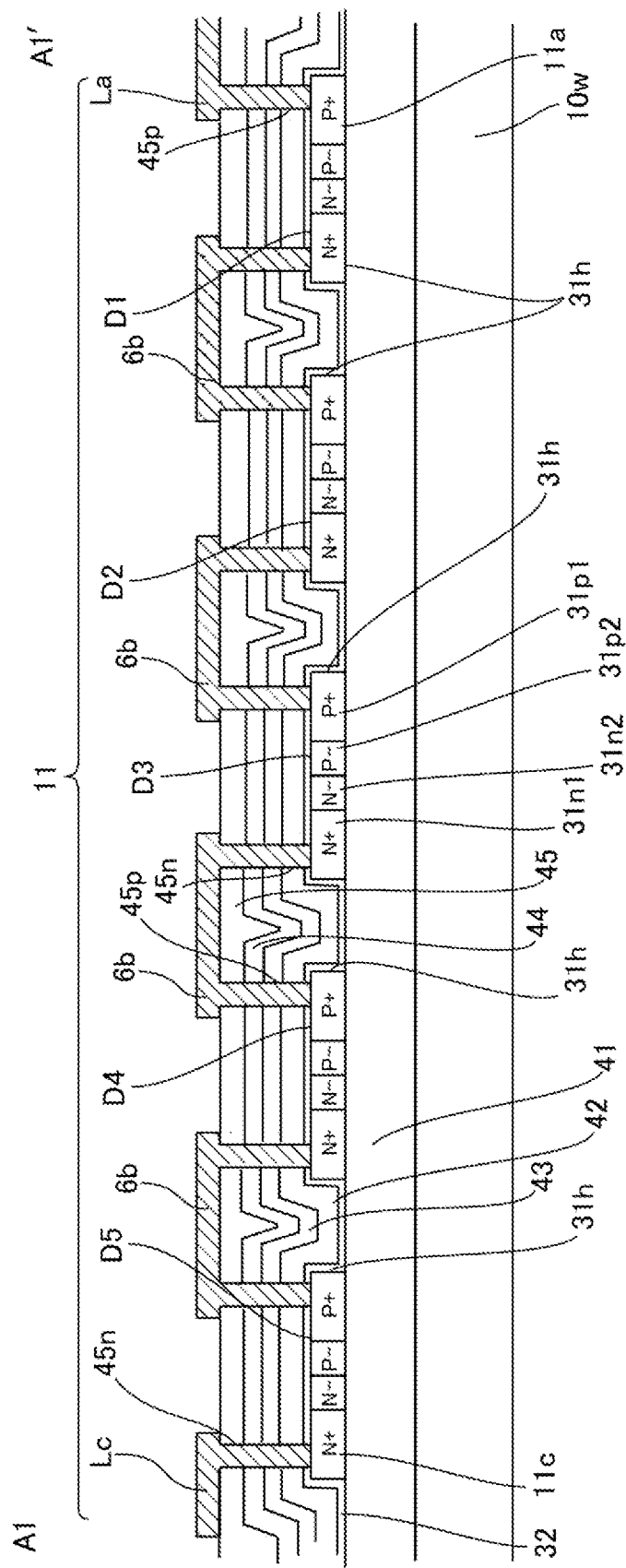
FIG. 8 is a cross-sectional view schematically illustrating a cross section of the temperature detecting element illustrated in FIG. 7.

FIG. 7 is a plan view schematically illustrating a planar configuration of the temperature detecting element 11 illustrated in FIG. 5. FIG. 8 is a cross-sectional view schematically illustrating a cross section of the temperature detecting element 11 illustrated in FIG. 7. FIG. 8 corresponds to the cross section at the A1-A1' in FIG. 7. Note that, in FIG. 8, layers or the like at the upper layer side of the temperature detecting element 11 formed at the first substrate 10 are omitted in a manner in which no inconvenience occurs from the viewpoint of explanation.

In the present mode, in order to configure the temperature detecting element 11 illustrated in FIG. 5, a plurality of semiconductor layers 31h that are spaced apart from each other in an island manner are provided as illustrated in FIGS. 7 and 8, and the plurality of semiconductor layers 31h are used to configure the diode elements D. More specifically, an N-type region and a P-type region are provided at each of the plurality of semiconductor layers 31h. In the present mode, the N-type region includes a high density N-type region N+31n1 and a low density N-type region N−31n2. The P-type region includes a high density P-type region P+31p1 and a low density P-type region P−31p2. The connecting portion between the low density N-type region N−31n2 and the low density P-type region P−31p2 constitutes a PN joint surface. Note that the configuration of the joining portion is not limited to this configuration.

A relay electrode 6b electrically connected to the diode element D is formed at the upper layer of the insulating film 45. Each of a plurality of relay electrodes 6b is electrically connected to the high density P-type region P+31p1 of the semiconductor layer 31h and the high density N-type region N+31n1 of the adjacent semiconductor layer 31h through contact holes 45p and 45n extending through the gate insulating film 32 and the insulating films 42, 43, 44, and 45. In addition, of the semiconductor layers 31h, two semiconductor layers 31h disposed at both ends are electrically connected to the anode wiring line La and the cathode wiring line Lc through the contact holes 45p and 45n extending through the gate insulating film 32 and the insulating films 42, 43, 44, and 45.

The semiconductor layer 31h is formed at the same layer and at the same time as the semiconductor layer 31a illustrated in FIG. 4, and thus, the thickness thereof or the like are the same as that of the semiconductor layer 31a. The N-type region and the P-type region are formed by utilizing a step of manufacturing the driving transistor constituting the scanning line drive circuit or the like illustrated in FIG. 1 and the pixel transistor illustrated in FIG. 4. Furthermore, the relay electrode 6b is disposed, for example, at the same layer as the data line 6a, the capacitance line 8a, and the like illustrated in FIG. 4.

1-6. Specific Configuration of Electrostatic Protection Circuit 12

Figure 9:
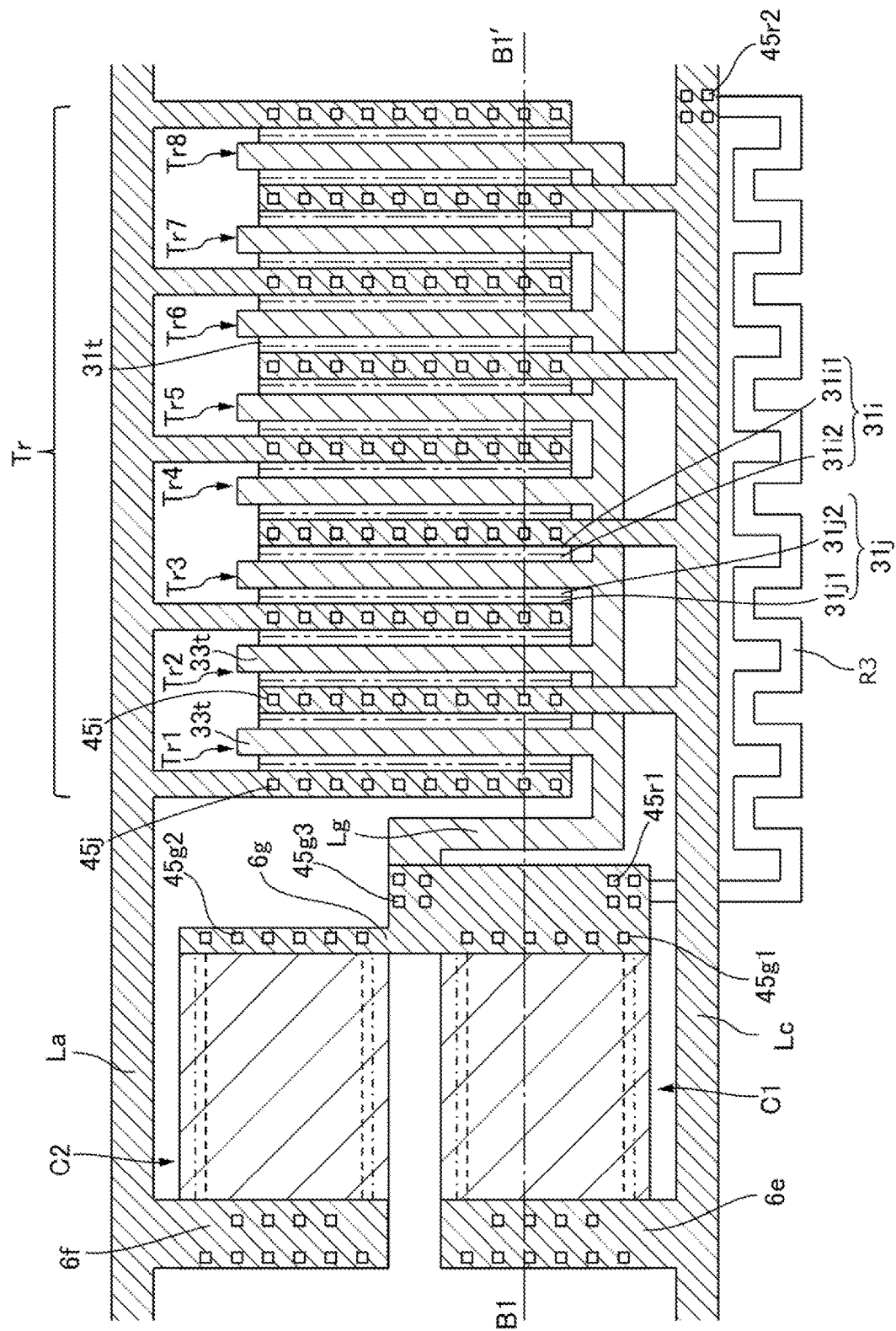
FIG. 9 is a plan view schematically illustrating a planar configuration of the electrostatic protection circuit illustrated in FIG. 5.
Figure 10:
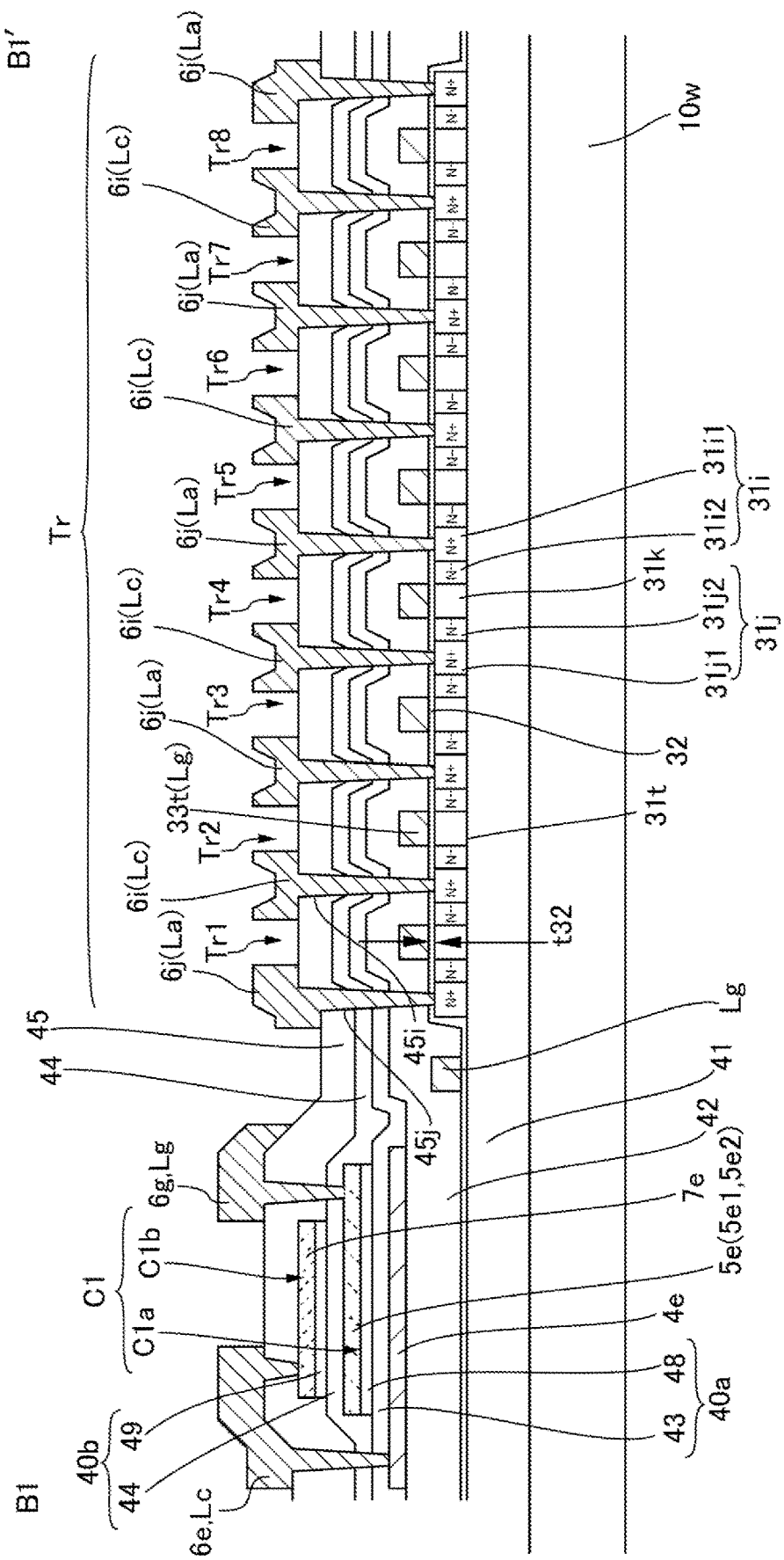
FIG. 10 is a cross-sectional view schematically illustrating a cross section of the electrostatic protection circuit illustrated in FIG. 9.
Figure 11:
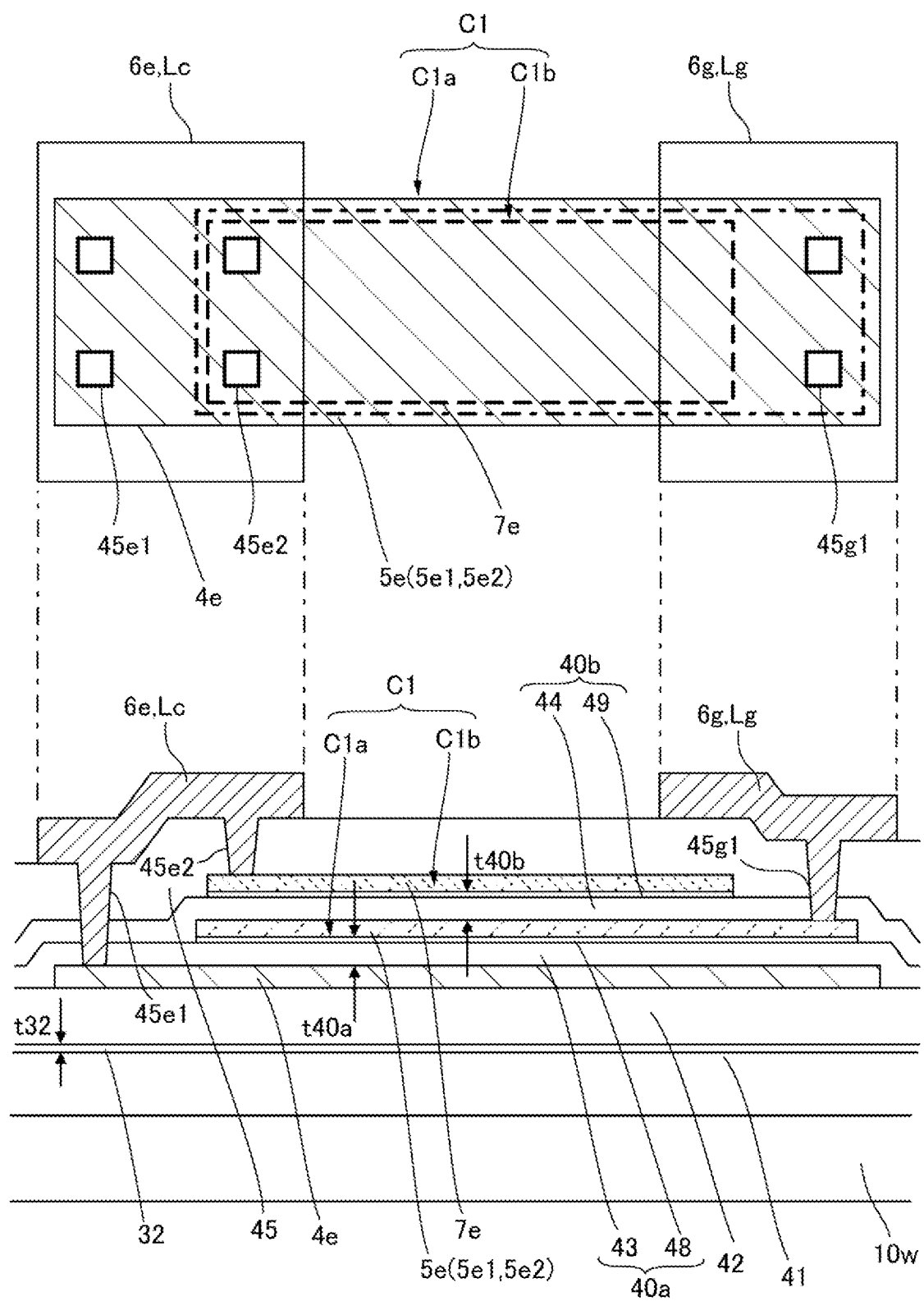
FIG. 11 is an explanatory view illustrating, in an enlarged manner, the first capacitance element illustrated in FIG. 10.
Figure 12:
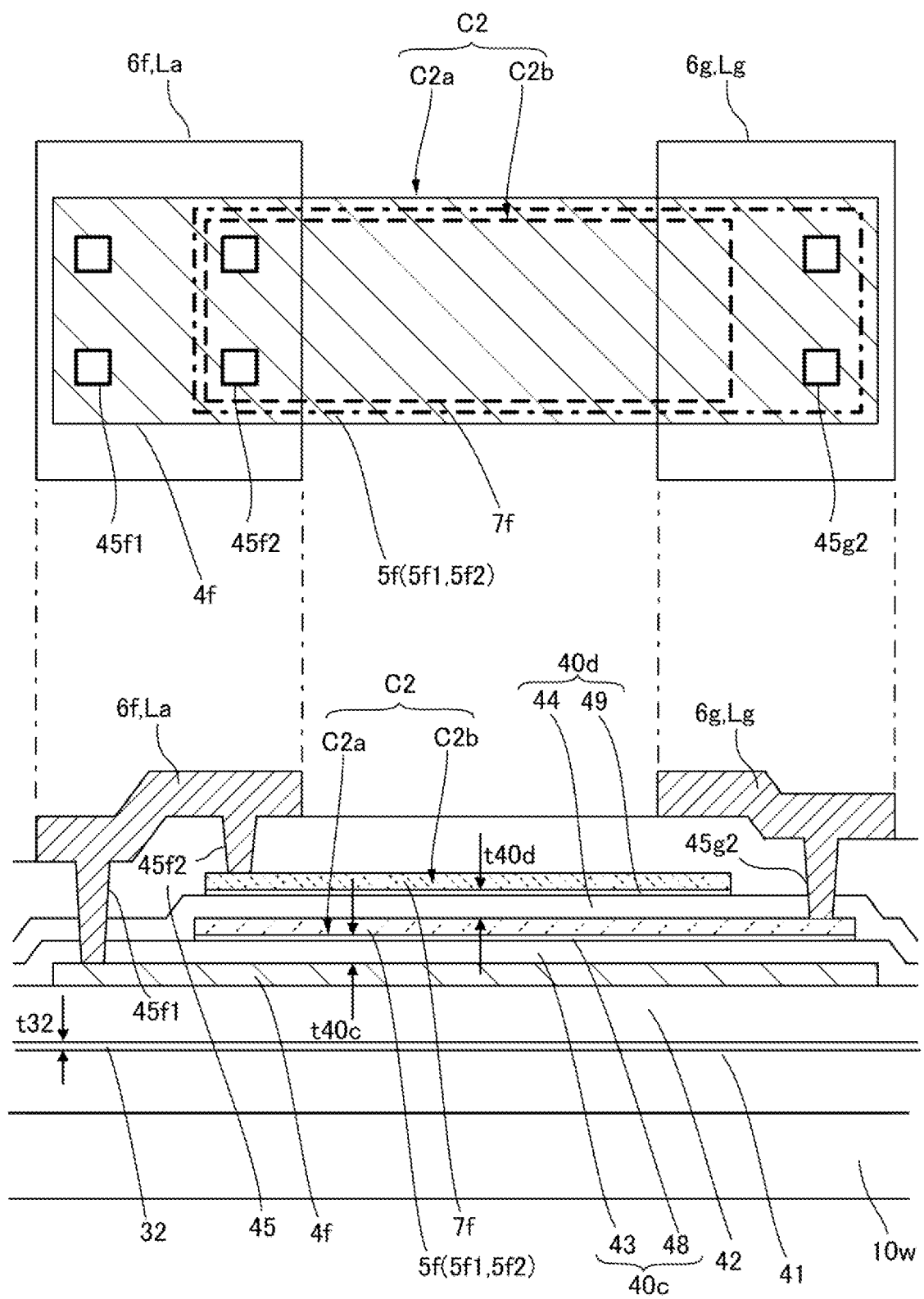
FIG. 12 is an explanatory view illustrating, in an enlarged manner, the second capacitance element illustrated in FIG. 10.

FIG. 9 is a plan view schematically illustrating a planar configuration of the electrostatic protection circuit 12 illustrated in FIG. 5. FIG. 10 is a cross-sectional view schematically illustrating a cross section of the electrostatic protection circuit 12 illustrated in FIG. 9. FIG. 10 corresponds a cross section at the B1-B1' in FIG. 9. FIG. 11 is an explanatory view illustrating the first capacitance element C1 illustrated in FIG. 10 in an enlarged manner. In FIG. 11, the upper portion illustrates the configuration of the first capacitance element C1 in plan view, and the lower portion illustrates the configuration of the first capacitance element C1 in cross section. FIG. 12 is an explanatory view illustrating the second capacitance element C2 illustrated in FIG. 10 in an enlarged manner. In FIG. 12, the upper portion illustrates the configuration of the second capacitance element C2 in plan view, and the lower portion illustrates the configuration of the second capacitance element C2 in cross section. Note that, in FIGS. 10, 11, and 12, layers or the like at the upper layer side of the first capacitance element C1 and the second capacitance element C2 formed at the first substrate 10 are omitted in a manner in which no inconvenience occurs from the viewpoint of explanation.

As illustrated in FIGS. 9 and 10, in the transistor Tr of the electrostatic protection circuit 12, a plurality of unit transistor elements Tr1 to Tr8 are formed by using the semiconductor layer 31t that has been integrally formed, and the plurality of unit transistor elements Tr1 to Tr8 are electrically connected in parallel to configure the transistor Tr. More specifically, a plurality of gate electrodes 33t are formed at the upper layer side of the semiconductor layer 31t, and the plurality of gate electrodes 33t each overlap with the semiconductor layer 31t through the gate insulating film 32. Of the semiconductor layer 31t, a region that overlaps with the gate electrode 33t in plan view is a channel region 31k. The transistor Tr is an N-channel type thin film transistor having an LDD structure. Thus, the one-side source-drain region 31i and the other-side source-drain region 31j of the transistor TR each include a high density N-type region 31i1, 31j1 spaced apart from the channel region 31k and a low density N-type region 31i2, 31j2 disposed between the channel region 31k and the high density N-type region 31i1, 31j1.

A plurality of source-drain electrodes 6i, 6j are formed at the upper layer of the gate electrode 33t. The plurality of source-drain electrodes 6i, 6j are each electrically connected to the one-side source-drain region 31i and the other-side source-drain region 31j of the semiconductor layer 31t through a contact hole 45i, 45j extending through the gate insulating film 32 and the insulating films 42, 43, 44, and 45. In addition, each of the plurality of gate electrodes 33t is electrically connected to the gate wiring line Lg.

The semiconductor layer 31t is formed at the same layer as the semiconductor layer 31a illustrated in FIG. 4 at the same time, and hence, the thickness and the like thereof are equal to those of the semiconductor layer 31a. The one-side source-drain region 31i and the other-side source-drain region 31j are formed by utilizing a process of manufacturing the driving transistor constituting the scanning line drive circuit or the like illustrated in FIG. 1 and the pixel transistor illustrated in FIG. 4. In addition, the source-drain electrodes 6i and 6j are disposed, for example, at the same layer as the data line 6a illustrated in FIG. 4.

In FIG. 9, the resistance element R3 is disposed at an opposite side of the cathode wiring line Lc from the transistor Tr using an electrically conductive polysilicon film disposed at the same layer as the semiconductor layer 31a illustrated in FIG. 4. However, the resistance element R3, the first resistance element R1, and the second resistance element R2 are not limited to be comprised of the electrically conductive polysilicon film, and may be made of a metal material such as tungsten silicide or aluminum.

As illustrated in FIGS. 9, 10, and 11, in the electrostatic protection circuit 12, the first capacitance element C1 is configured between layers of the insulating film 42 and the insulating film 45. More specifically, between layers of the insulating film 42 and the insulating film 45, a first capacitance electrode 4e, a first dielectric layer 40a, and a second capacitance electrode 5e1 are stacked sequentially from the insulating film 42 side toward the insulating film 45 side to configure a first capacitance portion C1a. In addition, a third capacitance electrode 5e2, a second dielectric layer 40b, and a fourth capacitance electrode 7e are stacked sequentially from the first capacitance portion C1a side toward the insulating film 45 side to form a second capacitance portion C1b.

In the present mode, the second capacitance electrode 5e1 and the third capacitance electrode 5e2 are comprised of the same electrically conducting film 5e. In other words, the same electrode pattern is referred to as the second capacitance electrode 5e1 or the third capacitance electrode 5e2, for the purpose of convenience. Furthermore, the first dielectric layer 40a is comprised of the insulating film 43 and the insulating film 48 stacked sequentially from the first capacitance electrode 4e side toward the second capacitance electrode 5e1 side. The second dielectric layer 40b is comprised of the insulating film 44 and the insulating film 49 stacked sequentially from the third capacitance electrode 5e2 side toward the fourth capacitance electrode 7e side. The insulating film 48 is patterned into the same shape as that of the electrically conducting film 5e, and the insulating film 48 and the electrically conducting film 5e overlap with each other in plan view. The insulating film 49 is patterned into the same shape as that of the fourth capacitance electrode 7e, and the insulating film 49 and the fourth capacitance electrode 7e overlap with each other in plan view.

As illustrated in FIGS. 9 and 12, in the electrostatic protection circuit 12, the second capacitance element C2 is configured between layers of the insulating film 42 and the insulating film 45. More specifically, between layers of the insulating film 42 and the insulating film 45, the fifth capacitance electrode 4f, the third dielectric layer 40c, and the sixth capacitance electrode 5f1 are stacked sequentially from the insulating film 42 side toward the insulating film 45 side to configure a third capacitance portion C2a. Furthermore, the seventh capacitance electrode 5f2, the fourth dielectric layer 40d, and the eighth capacitance electrode 7f are stacked sequentially from the third capacitance portion C2a side toward the insulating film 45 side to configure a fourth capacitance portion C2b.

In the present mode, the sixth capacitance electrode 5f1 and the seventh capacitance electrode 5f2 are comprised of the same electrically conducting film 5f. In other words, the same electrode pattern is referred to as the sixth capacitance electrode 5f1 or the seventh capacitance electrode 5f2, for the purpose of convenience. In addition, the third dielectric layer 40c is comprised of the insulating film 43 and the insulating film 48 stacked sequentially from the fifth capacitance electrode 4f side toward the sixth capacitance electrode 5f1 side. The fourth dielectric layer 40d is comprised of the insulating film 44 and the insulating film 49 stacked sequentially from the seventh capacitance electrode 5f2 side toward the eighth capacitance electrode 7f side. The insulating film 48 is patterned into the same shape as that of the electrically conducting film 5f. The insulating film 48 and the electrically conducting film 5f overlap with each other in plan view. The insulating film 49 is patterned into the same shape as that of the eighth capacitance electrode 7f. The insulating film 49 and the eighth capacitance electrode 7f overlap with each other in plan view.

The first capacitance electrode 4e and the fifth capacitance electrode 4f are formed at the same time and at the same layer as the first electrode 4a illustrated in FIG. 4, and thus, the thickness thereof or the like are the same as that of the first electrode 4a. The second capacitance electrode 5e1 (third capacitance electrode 5e2) and the sixth capacitance electrode 5f1 (seventh capacitance electrode 5f2) are formed at the same time and at the same layer as the second electrode 5a (third electrode 5b) illustrated in FIG. 4, and thus, the thickness thereof or the like are the same as that of the second electrode 5a (third electrode 5b).

As illustrated in FIGS. 9, 11, and 12, relay electrodes 6e, 6f, and 6g are formed at the upper layer of the insulating film 45. The relay electrode 6g is provided so as to overlap with an end portion of the electrically conducting film 5e of the first capacitance element C1 and an end portion of the electrically conducting film 5f of the second capacitance element C2. Thus, the relay electrode 6g is electrically connected to the electrically conducting film 5e through a contact hole 45g1 extending through the insulating films 44 and 45, and is also electrically connected to the electrically conducting film 5f through a contact hole 45g2 extending through the insulating films 44 and 45.

As illustrated in FIG. 11, the relay electrode 6e is electrically connected to the first capacitance electrode 4e through a contact hole 45e1 extending through the insulating films 43, 44, and 45, and is electrically connected to the fourth capacitance electrode 7e through a contact hole 45e2 extending through the insulating film 45. Thus, the first capacitance element C1 has a structure in which the first capacitance portion C1a and the second capacitance portion C1b are electrically connected in parallel.

As illustrated in FIG. 12, the relay electrode 6f is electrically connected to the fifth capacitance electrode 4f through a contact hole 45f1 extending through the insulating films 43, 44, and 45, and is electrically connected to the eighth capacitance electrode 7f through a contact hole 45f2 extending through the insulating film 45. Thus, the second capacitance element C2 has a structure in which the third capacitance portion C2a and the fourth capacitance portion C2b are electrically connected in parallel.

Here, the relay electrode 6g constitutes the connecting node Cn between the first capacitance element C1 and the second capacitance element C2, and is electrically connected to the gate wiring line Lg through a contact hole 45g3 illustrated in FIG. 9. Furthermore, the relay electrode 6g is electrically connected to one-side end of the resistance element R3 through a contact hole 45r1 illustrated in FIG. 9. The cathode wiring line Lc is electrically connected to the other-side end of the resistance element R3 through a contact hole 45r2 illustrated in FIG. 9. In other words, the cathode wiring line Lc and the connecting node Cn are electrically connected to each other through the resistance element R3. Thus, in a static state, the cathode wiring line Lc and the connecting node Cn have the same potential. Note that the first resistance element R1 and the second resistance element R2 illustrated in FIG. 5 or the like are electrically connected to the anode wiring line La and the cathode wiring line Lc through a contact hole (not illustrated) extending through the insulating film 45 or the like, as with the resistance element R3.

In the present mode, each of the circuit elements has, for example, the following sizes or the like. However, these should not be limited to the following conditions.

Transistor Tr: channel width W=800 μm, channel length L=5 μm

Electrostatic capacity of first capacitance element C1=5 pF

Electrostatic capacity of second capacitance element C2=5 pF

Resistance value of first resistance element R1=10 kΩ

Resistance value of second resistance element R2=10 kΩ

Resistance value of resistance element R3=500 kΩ

1-7. Properties of First Capacitance Element C1

In the electrostatic protection circuit 12 of the temperature detecting circuit 1 in the electro-optical device 100 according to the present mode, the electrostatic capacity of the first capacitance element C1 is greater than the electrostatic capacity between the gate electrode 33t and the semiconductor layer 31t of the transistor Tr. In particular, in the present mode, the first capacitance element C1 has a structure in which the first capacitance portion C1a and the second capacitance portion C1b are electrically connected in parallel, and hence, the electrostatic capacity of the first capacitance element C1 is greater than the electrostatic capacity between the gate electrode 33t and the semiconductor layer 31t.

Similarly, the electrostatic capacity of the second capacitance element C2 is greater than the electrostatic capacity between the gate electrode 33t and the semiconductor layer 31t of the transistor Tr. In particular, in the present mode, the second capacitance element C2 has a structure in which the third capacitance portion C2a and the fourth capacitance portion C2b are electrically connected in parallel, and hence, the electrostatic capacity of the second capacitance element C2 is greater than the electrostatic capacity between the gate electrode 33t and the semiconductor layer 31t.

In addition, as illustrated in FIG. 11, the thickness t40a of the first dielectric layer 40a of the first capacitance element C1 is greater than the thickness t32 of the gate insulating film 32 of the transistor Tr. In particular, in the present mode, the first dielectric layer 40a of the first capacitance element C1 has a structure in which the insulating films 43 and 48 are stacked, and hence, the thickness t40a of the first dielectric layer 40a is greater than the thickness t32 of the gate insulating film 32 of the transistor Tr. In addition, the thickness t40b of the second dielectric layer 40b of the first capacitance element C1 is greater than the thickness t32 of the gate insulating film 32 of the transistor Tr. In particular, in the present mode, the second dielectric layer 40b of the first capacitance element C1 has a structure in which the insulating films 44 and 49 are stacked, and hence, the thickness t40b of the second dielectric layer 40b is greater than the thickness t32 of the gate insulating film 32 of the transistor Tr.

Furthermore, as illustrated in FIG. 12, the thickness t40c of the third dielectric layer 40c of the second capacitance element C2 is greater than the thickness t32 of the gate insulating film 32 of the transistor Tr. In particular, in the present mode, the third dielectric layer 40c of the second capacitance element C2 has a structure in which the insulating films 43 and 48 are stacked, and hence, the thickness t40c of the third dielectric layer 40c is greater than the thickness t32 of the gate insulating film 32 of the transistor Tr. In addition, the thickness of the fourth dielectric layer 40d of the second capacitance element C2 is greater than the thickness t32 of the gate insulating film 32 of the transistor Tr. In particular, in the present mode, the fourth dielectric layer 40d of the second capacitance element C2 has a structure in which the insulating films 44 and 49 are stacked, and hence, the thickness of the fourth dielectric layer 40d is greater than the thickness t32 of the gate insulating film 32 of the transistor Tr.

1-8. Operation and Effect of Present Embodiment

Figure 13:
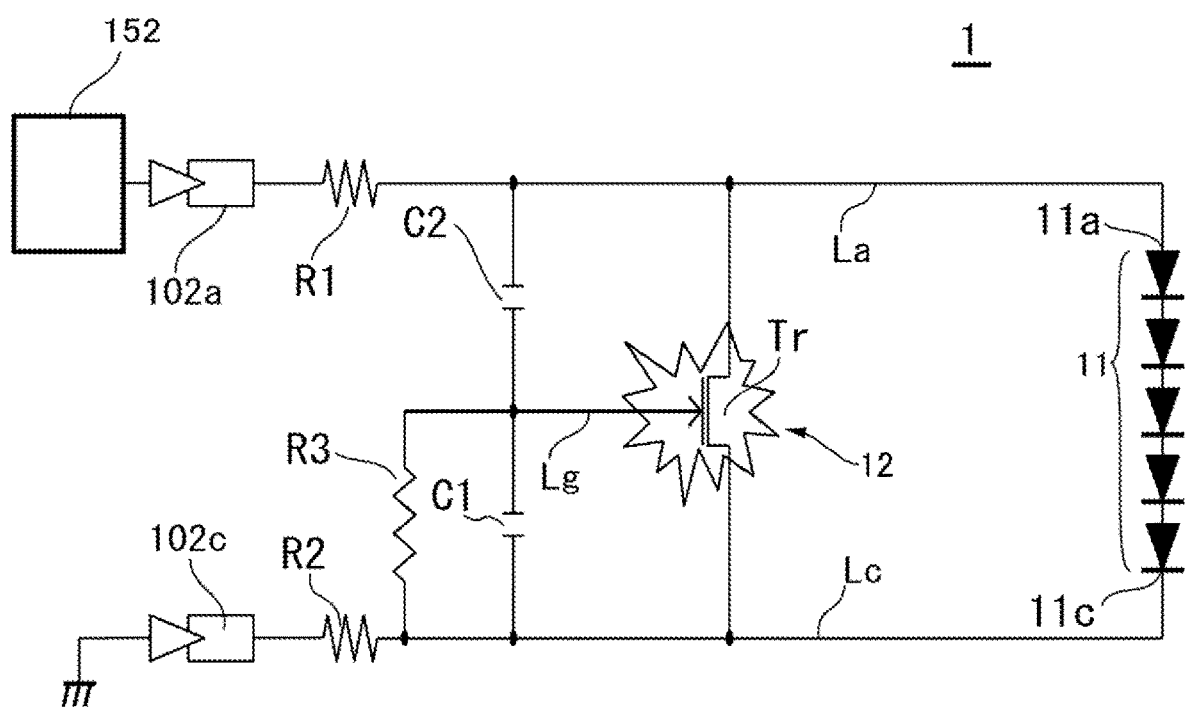
FIG. 13 is an explanatory view illustrating an operation and effect on a surge current in the electro-optical device according to an embodiment of the present disclosure.
Figure 14:
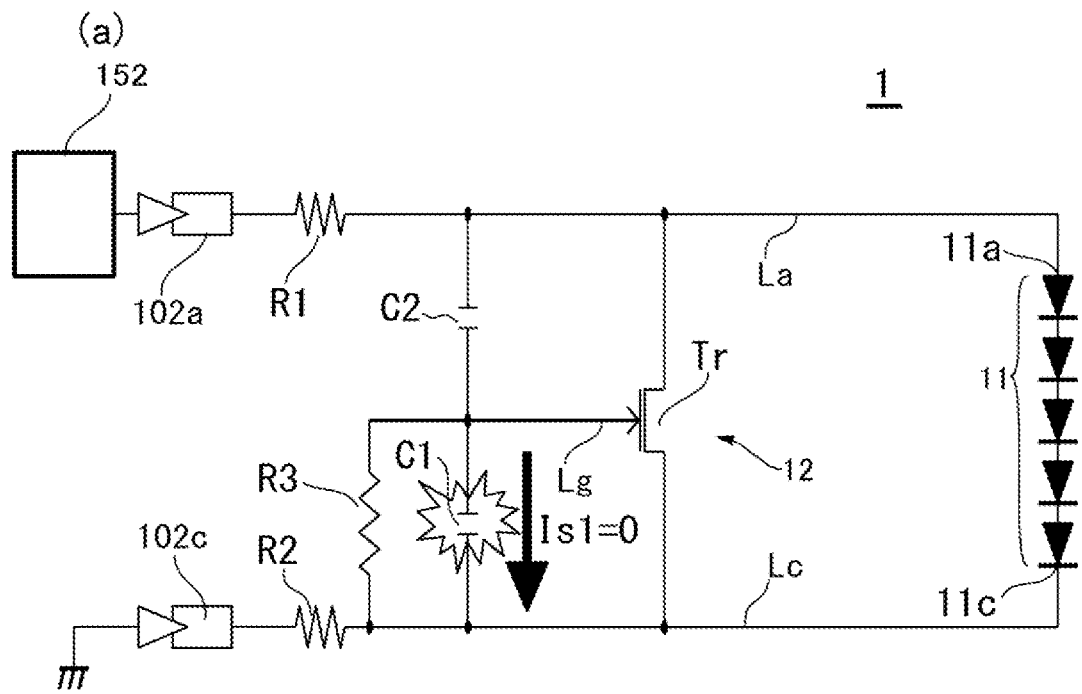
FIG. 14 is an explanatory view illustrating a problem in terms of detection of short-circuit in an electro-optical device according to a reference example in comparison to the present disclosure.
Figure 14:
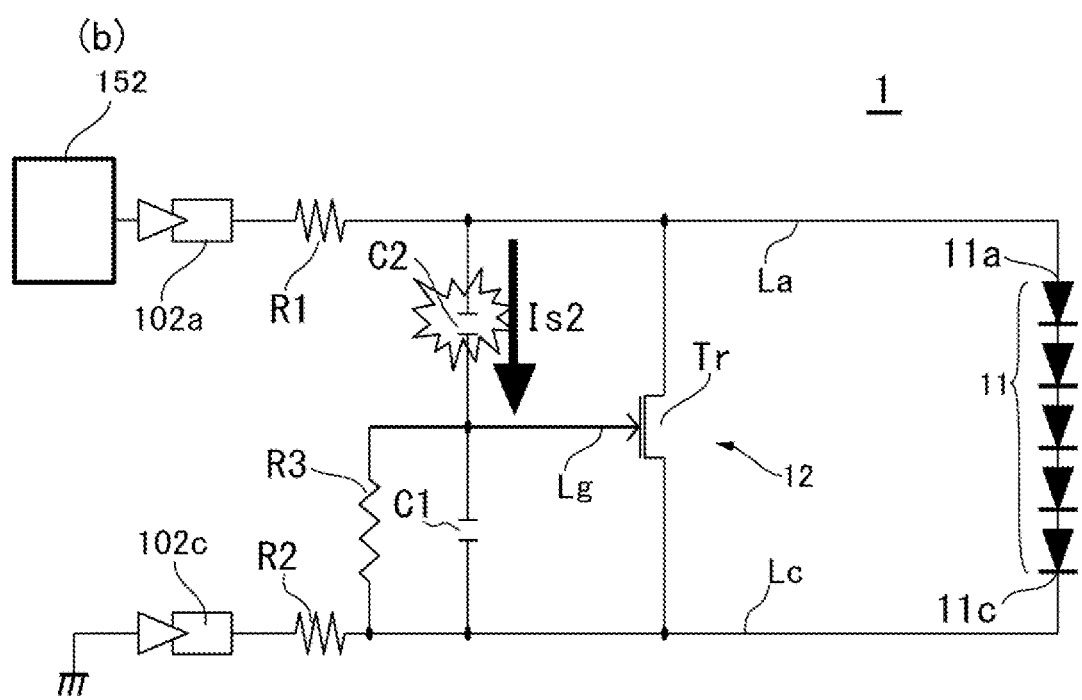

FIG. 13 is an explanatory view illustrating an operation and effect on a surge current in the electro-optical device 100 according to an embodiment of the present disclosure. FIG. 14 is an explanatory view illustrating a problem in terms of detection of short-circuit in an electro-optical device 100 according to a reference example in comparison to the present disclosure. Here, the electro-optical device 100 according to the reference example is configured such that the electrostatic capacity of the first capacitance element C1 is smaller than the electrostatic capacity between the gate electrode 33t and the semiconductor layer 31t, and the thickness t40a of the first dielectric layer 40a of the first capacitance element C1 and the thickness t40b of the second dielectric layer 40b are each smaller than the thickness of the gate insulating film 32 of the transistor Tr.

As described above, in the present embodiment, the electrostatic capacity of the first capacitance element C1 is greater than the electrostatic capacity between the gate electrode 33t and the semiconductor layer 31t. Thus, in a step of manufacturing the first substrate 10, when the same large electric charge is applied to the first capacitance element C1 and the gate electrode 33t of the transistor Tr, a voltage applied to the gate capacity of the transistor Tr having a small electrostatic capacity is greater than a voltage applied to the first capacitance element C1 having a large electrostatic capacity. In addition, the thickness t40a of the first dielectric layer 40a of the first capacitance element C1 and the thickness t40b of the second dielectric layer 40b are each greater than the thickness t32 of the gate insulating film 32 of the transistor Tr. In general, the withstand voltage increases with increase in the film thickness of a dielectric film. Thus, an electrical breakdown is less likely to occur in the first capacitance element C1 than the transistor Tr. For this reason, in a case where an abnormal process occurs, it is possible to lead the occurrence of damage to the transistor Tr, as illustrated in FIG. 13. In other words, damage occurring only in the first capacitance element C1, which typically is hidden, becomes apparent as damage occurring in the transistor Tr.

Thus, it is possible to detect occurrence of a failure in the temperature detecting circuit 1 by bringing a probe of the inspection circuit 152 into contact with the anode terminal 102a and the cathode terminal 102c to apply an inspection voltage to the temperature detecting circuit 1, and detecting an abnormal electric current resulting from damage in the transistor Tr.

In contrast, in the electro-optical device according to the reference example, the electrostatic capacity of the first capacitance element C1 is smaller than the electrostatic capacity between the gate electrode 33t and the semiconductor layer 31t, and the thickness t40a of the first dielectric layer 40a of the first capacitance element C1 and the thickness t40b of the second dielectric layer 40b are each smaller than the thickness t32 of the gate insulating film 32 of the transistor Tr. In a case of such a configuration, during a step of manufacturing the first substrate 10, the first capacitance element C1 or the second capacitance element C2 may be more likely to be damaged than the transistor Tr. Alternatively, as for a surge current expected to occur after the first substrate 10 is completed, the first capacitance element C1 or the second capacitance element C2 may be more likely to be damaged than the transistor Tr. In particular, when the first capacitance element C1 is damaged and the transistor Tr is normal, it is difficult to detect the failure. This is because, as illustrated in the first case (a) in FIG. 14, the resistance element R3 is electrically connected to the first capacitance element C1 in parallel, and hence, both electrodes of the first capacitance element C1 have the same potential due to the resistance element R3. Thus, the short-circuited current Is1 of the first capacitance element C1 is zero and cannot be detected. This makes it impossible to appropriately detect the abnormality of the temperature detecting circuit 1. In this case, the electrostatic protection circuit 12 gets malfunctioned, and cannot fulfill a predetermined protection function.

Note that, in the electro-optical device according to the reference example, when an electrical breakdown occurs in the second capacitance element C2 as illustrated in the second case (b) in FIG. 14, it is possible to detect a short-circuited current Is2 of the second capacitance element C2 at the time of supplying an inspection voltage from the inspection circuit 152 to the temperature detecting circuit 1, which makes it possible to detect occurrence of a failure in the temperature detecting circuit 1.

2. SECOND EMBODIMENT

Figure 15:
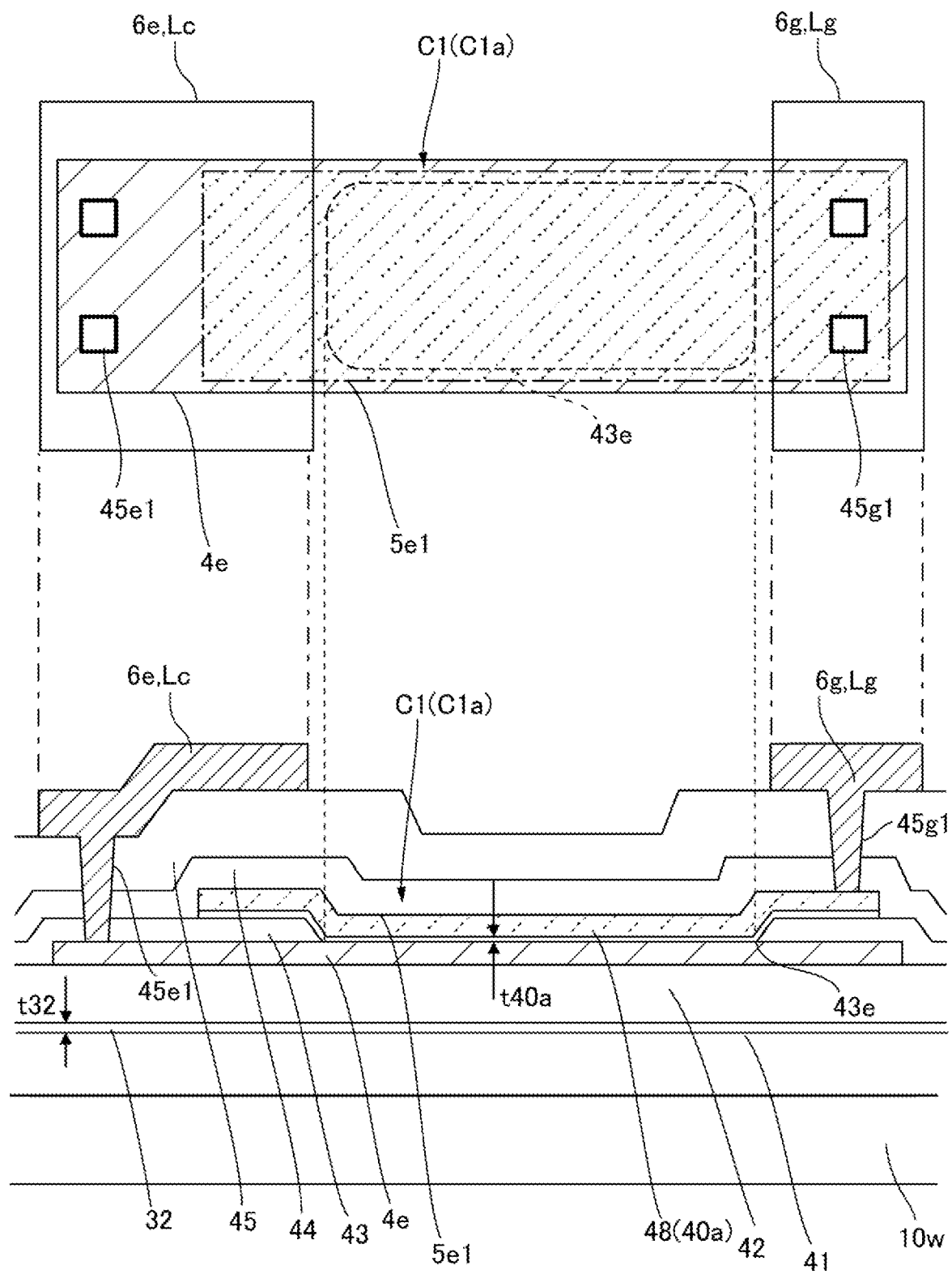
FIG. 15 is an explanatory view illustrating an electro-optical device according to a second embodiment of the present disclosure.

FIG. 15 is an explanatory view illustrating an electro-optical device 100 according to a second embodiment of the present disclosure. In FIG. 15, the upper portion illustrates the configuration of the first capacitance element C1 in plan view, and the lower portion illustrates the configuration of the first capacitance element C1 in cross section. Note that the basic configuration of the present mode is similar to that of the first embodiment. Thus, the same reference characters are attached to the common portions, and explanation thereof will not be repeated.

In the present mode, the first capacitance element C1 is configured between layers of the insulating film 42 and the insulating film 44, as illustrated in FIG. 15. More specifically, between layers of the insulating film 42 and the insulating film 44, the first capacitance electrode 4e, the insulating film 43, the insulating film 48, and the second capacitance electrode 5e1 are stacked sequentially from the insulating film 42 side toward the insulating film 44 side. An opening portion 43e that exposes part of the first capacitance electrode 4e is formed in a region of the insulating film 43 that overlaps with the first capacitance electrode 4e and the second capacitance electrode 5e1. Thus, in the inside of the opening portion 43e, the first capacitance electrode 4e and the second capacitance electrode 5e1 overlap with each other through the insulating film 48. The first dielectric layer 40a of the first capacitance element C1 is comprised of the insulating film 48. Here, the first capacitance element C1 is comprised only of the first capacitance portion C1a, and no second capacitance portion C1b that has been described in the first embodiment is provided.

In a case of the first embodiment, the first capacitance element C1 has a stack structure in which the first capacitance portion C1a and the second capacitance portion C1b overlap with each other. Thus, in the second capacitance portion C1b disposed at the higher layer than the first capacitance portion C1a, the second dielectric layer 40b may have an inappropriate film thickness due to attachment of foreign substances during processes of formation or the shape of the front surface of the formed film or the like. This may lead to a reduction in the withstand voltage. For this reason, in the second embodiment, the first capacitance element C1 is comprised only of the first capacitance portion C1a. With this configuration, the number of manufacturing steps until formation of the first capacitance portion C1a is less than the number of manufacturing steps until formation of the second capacitance portion C1b. This makes it possible to reduce a possibility that the withstand voltage of the first capacitance element C1 reduces. Thus, it is possible to achieve the first capacitance element C1 having favorable yield and favorable withstand voltage.

For this reason, in the electro-optical device 100, the retention capacitor 55 provided in each of the pixels 100a illustrated in FIG. 3 has a stack structure in which the first retention capacitor 551 and the second retention capacitor 552 overlap with each other as illustrated in FIG. 4, and is configured so as to give the pixel aperture ratio a higher priority. On the other hand, it is preferable that the capacitance element (in particular, the first capacitance element C1) of the temperature detecting circuit 1 has a non-stack structure in which no second capacitance portion C1b is provided and only the first capacitance portion C1a is provided, and is configured so as to give a withstand-voltage performance a higher priority. This configuration makes it possible to achieve a bright electro-optical device 100 including the temperature detecting circuit 1 having a high reliability.

Furthermore, the first embodiment employs the stack structure in which the first capacitance portion C1a and the second capacitance portion C1b overlap with each other. Thus, in plan view, three electrode layers that constitute the first capacitance portion C1a and the second capacitance portion C1b are viewed in an overlapping manner. Thus, it is difficult to identify the abnormal portion on the basis of the observation from the outside. That is, it is difficult to determine which of the first capacitance portion C1a and the second capacitance portion C1b has a problem. However, by employing a non-stack structure and a configuration in which only the first capacitance portion C1a is provided as in the second embodiment, it is easy to identify the abnormal portion only on the basis of the observation from the outside.

In addition, in the present mode, the film thickness of the insulating film 48 that constitutes the first dielectric layer 40a may be smaller than the film thickness of the gate insulating film 32. For example, the thickness of the insulating film 48 is, for example, 85 nm, and the thickness of the gate insulating film 32 is, for example, 100 nm. Furthermore, the insulating film 48 may be a silicon nitride film having a relative dielectric constant greater than the silicon oxide film. In this case, it is possible to further easily increase the electrostatic capacity of the first capacitance element C1. For this reason, it is possible to easily set the electrostatic capacity of the first capacitance element C1 to be greater than the electrostatic capacity between the gate electrode 33t and the semiconductor layer 31t of the transistor Tr. Thus, it is possible to achieve an effect similar to that of the first embodiment, which includes, for example, an electrical breakdown occurring in the transistor Tr earlier than the first capacitance element C1.

In addition, in the present mode, the insulating film 48 that constitutes the first dielectric layer 40a is formed up to the outside of the opening portion 43e. In the outside of the opening portion 43e, the insulating film 43 overlaps with the end portion of the second capacitance electrode 5e1. Thus, the first capacitance electrode 4e and the second capacitance electrode 5e1 overlaps with each other with the insulating films 43 and 48 being interposed therebetween at the outside of the opening portion 43e. Thus, the thickness of an insulating film disposed between the first capacitance electrode 4e and the second capacitance electrode 5e1 is greater in a peripheral area of the insulating film that overlaps with an end portion of the first capacitance electrode 4e and an end portion of the second capacitance electrode 5e1 in plan view, than that in a region of the inside of this peripheral area where the first capacitance electrode 4e and the second capacitance electrode 5e1 overlap with each other in plan view. This configuration alleviates the concentration of electric field at the end of the second capacitance electrode 5e1, which makes it possible to increase the withstand voltage of the first capacitance element C1.

It is preferable to round the shape of the rectangular vertex of the opening portion 43e. This shape eliminates the acute angle portion of the opening portion 43e in plan view at the second capacitance electrode 5e1 that is opposed to the first capacitance electrode 4e, which alleviates the concentration of electric field at the end of the second capacitance electrode 5e1. For example, the curvature of the vertex of the opening portion 43e is set to be equal to or more than R=1 um. Alternatively, it may be possible to configure the angle of the vertex of the opening portion 43e so as to be greater than 90 degrees. In this case, the vertex has a corner cut shape although the vertex typically has a right angle shape. Note that the configuration of the second capacitance element C2 is similar to that of the first capacitance element C1, and hence, explanation thereof will not be repeated.

3. THIRD EMBODIMENT

Figure 16:
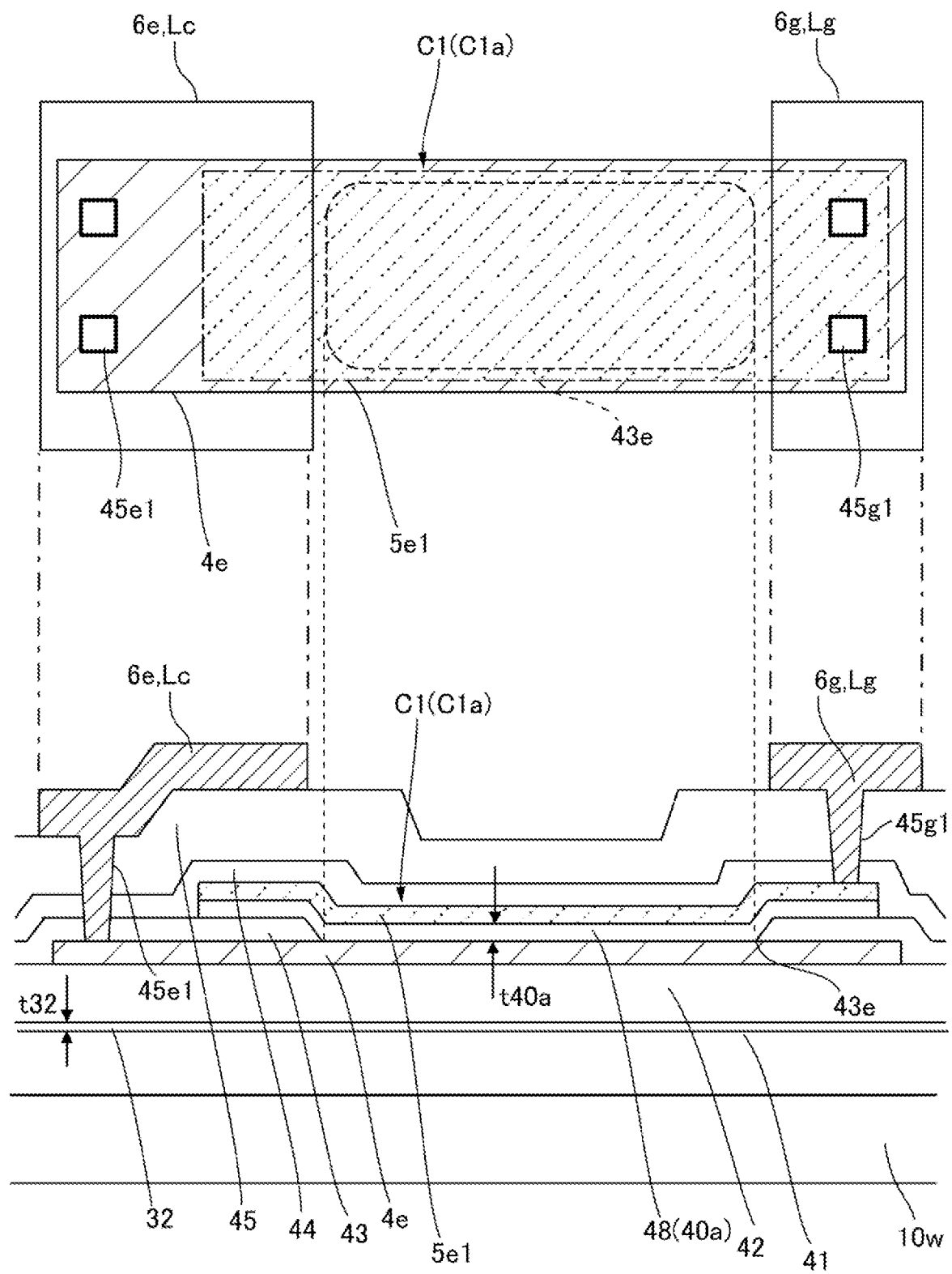
FIG. 16 is an explanatory view illustrating an electro-optical device according to a third embodiment of the present disclosure.

FIG. 16 is an explanatory view illustrating an electro-optical device 100 according to a third embodiment of the present disclosure. In FIG. 16, the upper portion illustrates the configuration of the first capacitance element C1 in plan view, and the lower portion illustrates the configuration of the first capacitance element C1 in cross section. Note that the basic configuration of the present mode is similar to that of the first embodiment. Thus, the same reference characters are attached to the common portions, and explanation thereof will not be repeated.

In the present mode, in the electrostatic protection circuit 12, the first capacitance element C1 is configured between layers of the insulating film 42 and the insulating film 44, as illustrated in FIG. 16. More specifically, the first capacitance electrode 4e, the insulating film 43, the insulating film 48, and the second capacitance electrode 5e1 are sequentially stacked from the insulating film 42 side toward the insulating film 44 side. An opening portion 43e that exposes part of the first capacitance electrode 4e is formed in a region of the insulating film 43 that overlaps with the first capacitance electrode 4e and the second capacitance electrode 5e1. Thus, in the inside of the opening portion 43e, the first capacitance electrode 4e and the second capacitance electrode 5e1 overlap with each other with the insulating film 48 being interposed therebetween. In addition, the first dielectric layer 40a of the first capacitance element C1 is comprised of the insulating film 48. Here, the first capacitance element C1 is comprised only of the first capacitance portion C1a, and no second capacitance portion C1b that has been described in the first embodiment is provided.

In the present mode, the film thickness of the insulating film 48 that constitutes the first dielectric layer 40a is greater than that of the gate insulating film 32. For example, the thickness t40a of the insulating film 48 is, for example, 100 nm, and the thickness t32 of the gate insulating film 32 is, for example, 85 nm. In general, the withstand voltage favorably increases with increase in the film thickness of the insulating film. For this reason, the withstand voltage of the first capacitance element C1 can be greater than the withstand voltage between the gate electrode 33t and the semiconductor layer 31t of the transistor Tr. Thus, it is possible to achieve an effect similar to that of the first embodiment, which includes, for example, an electrical breakdown occurring in the transistor Tr earlier than the first capacitance element C1.

In addition, in the present mode, the insulating film 48 that constitutes the first dielectric layer 40a is formed up to the outside of the opening portion 43e. In the outside of the opening portion 43e, the insulating film 43 overlaps with the end portion of the second capacitance electrode 5e1. Thus, the first capacitance electrode 4e and the second capacitance electrode 5e1 overlaps with each other with the insulating films 43 and 48 being interposed therebetween at the outside of the opening portion 43e. Thus, the thickness of an insulating film disposed between the first capacitance electrode 4e and the second capacitance electrode 5e1 is greater in a peripheral area of the insulating film that overlaps with an end portion of the first capacitance electrode 4e and an end portion of the second capacitance electrode 5e1 in plan view, than that in a region of the inside of this peripheral area where the first capacitance electrode 4e and the second capacitance electrode 5e1 overlap with each other in plan view. This configuration alleviates the concentration of electric field at the end of the second capacitance electrode 5e1, which makes it possible to increase the withstand voltage of the first capacitance element C1.

In the present mode, the first capacitance element C1 is comprised only of the first capacitance portion C1a, and no second capacitance portion C1b that has been described in the first embodiment is provided. In addition, the film thickness of the insulating film 48 that constitutes the first dielectric layer 40a is greater than that of the gate insulating film 32. Even with such a configuration, in the present mode, it is possible to set the electrostatic capacity of the first capacitance element C1 so as to be greater than the electrostatic capacity between the gate electrode 33t and the semiconductor layer 31t of the transistor Tr.

For example, the relative dielectric constant of the silicon oxide film used for the insulating film 48 is set to 3.9, and the planar area of the opening portion 43e is set to approximately 14500 μm2. In this case, by setting the opening portion 43e so as to have a substantially rectangular shape of 145 μm×100 μm, the opening portion 43e has a size that can be disposed in the first substrate 10. In a case of such a configuration, the electrostatic capacity of the first capacitance element C1 is approximately 5 pF.

In addition, the transistor Tr is divided into a plurality of eight unit transistor elements connected in parallel. Each of the elements has a channel width W=100 μm and a channel length L=5 μm. Here, by setting the relative dielectric constant of the gate insulating film 32 to 3.9, the thickness t32 of the gate insulating film 32 is 85 nm, and the gate capacity of each of the unit transistor elements is approximately 0.2 pF. Thus, the gate capacity of the transistor Tr is approximately 1.6 pF. For this reason, it is possible to set the electrostatic capacity of the first capacitance element C1 to be greater than the electrostatic capacity between the gate electrode 33t and the semiconductor layer 31t of the transistor Tr.

4. FOURTH EMBODIMENT

Figure 17:
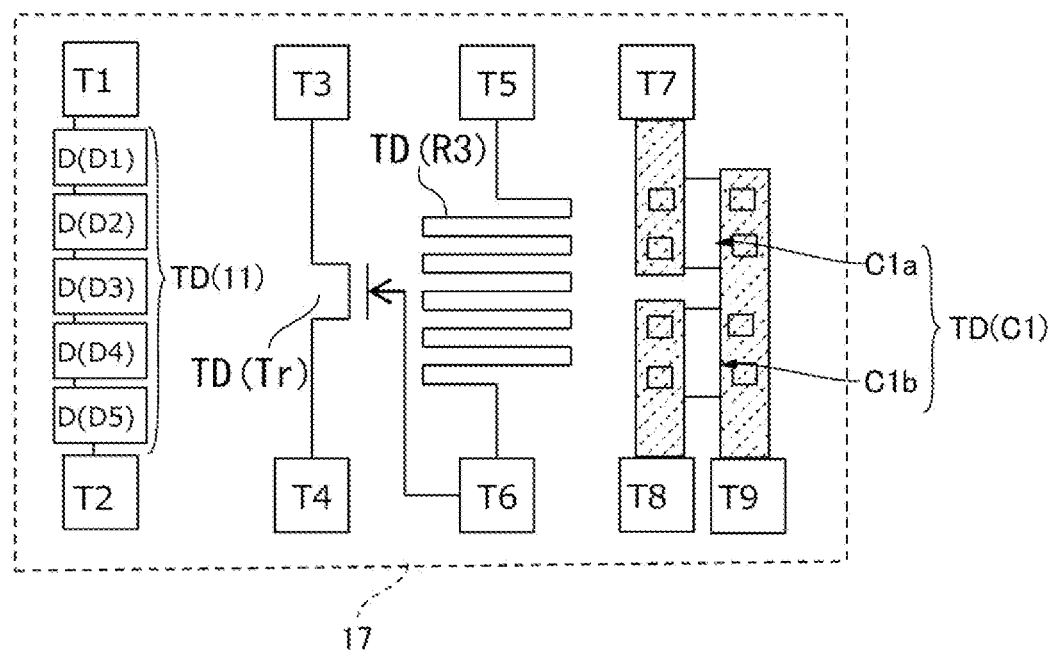
FIG. 17 is an explanatory view illustrating an electro-optical device according to a fourth embodiment of the present disclosure.

FIG. 17 is an explanatory view illustrating an electro-optical device 100 according to a fourth embodiment of the present disclosure. FIG. 17 schematically illustrates the planar structure of the inspection area 17 illustrated in FIG. 3. Note that the basic configuration of the present mode is similar to that of the first embodiment. Thus, the same reference characters are attached to the common portions, and explanation thereof will not be repeated.

A plurality of inspecting elements TD and a plurality of inspection terminals T1 to T9 electrically connected to the inspecting element TD are provided at the inspection area 17 illustrated in FIG. 3. The plurality of inspecting elements TD are formed at the same time and at the same layer as each of the temperature detecting element 11, the transistor Tr, the resistance element R3, and the first capacitance element C1 that constitute the temperature detecting circuit 1 illustrated in FIG. 5. Note that an inspection probe is brought into contact with the inspection terminals T1 to T9, and hence, the inspection terminals each have a size differing from the terminal 102 illustrated in FIG. 1.

This aspect makes it possible to inspect the electrical property of an inspecting element TD(11) corresponding to the temperature detecting element 11 using the inspection terminals T1 and T2. By using the inspection terminals T3, T4, and T6, it is possible to inspect the electrical property of an inspecting element TD(Tr) corresponding to the transistor Tr. By using the inspection terminals T5 and T6, it is possible to inspect the electrical property of an inspecting element TD(R3) corresponding to the resistance element R3. By using the inspection terminals T7, T8, and T9, it is possible to inspect the electrical property of an inspecting element TD(C1) corresponding to the first capacitance element C1. In a case of the first embodiment, the inspecting element TD(C1) corresponding to the first capacitance element C1 may be disposed so as to have a stack structure with the aim of simulating the actual configuration. In place of the inspecting element TD(R3) corresponding to the resistance element R3, an inspecting element corresponding to the first resistance element R1 or the second resistance element R2 may be disposed.

Furthermore, as illustrated in FIG. 3, the inspection area 17 is disposed along the side corresponding to the corner portion of the electro-optical device 100 where the temperature detecting element 11 and the electrostatic protection circuit 12 are disposed. With such a configuration, the same electrical elements in the inspection area 17, the temperature detecting element 11, and the electrostatic protection circuit 12 are processed in the same light exposure range, and are disposed in the vicinity. Thus, the same electrical elements in the inspection area 17, the temperature detecting element 11, and the electrostatic protection circuit 12 are set so as to have electrical properties close to each other. This makes it possible to detect an abnormality concerning formation of each of the electrical elements on the basis of measured values on the electrical element in the inspection area 17. In addition, it is possible to estimate or manage the performance of the temperature detecting circuit 1.

5. EXAMPLE OF CONFIGURATION OF ELECTRONIC DEVICE

Figure 18:
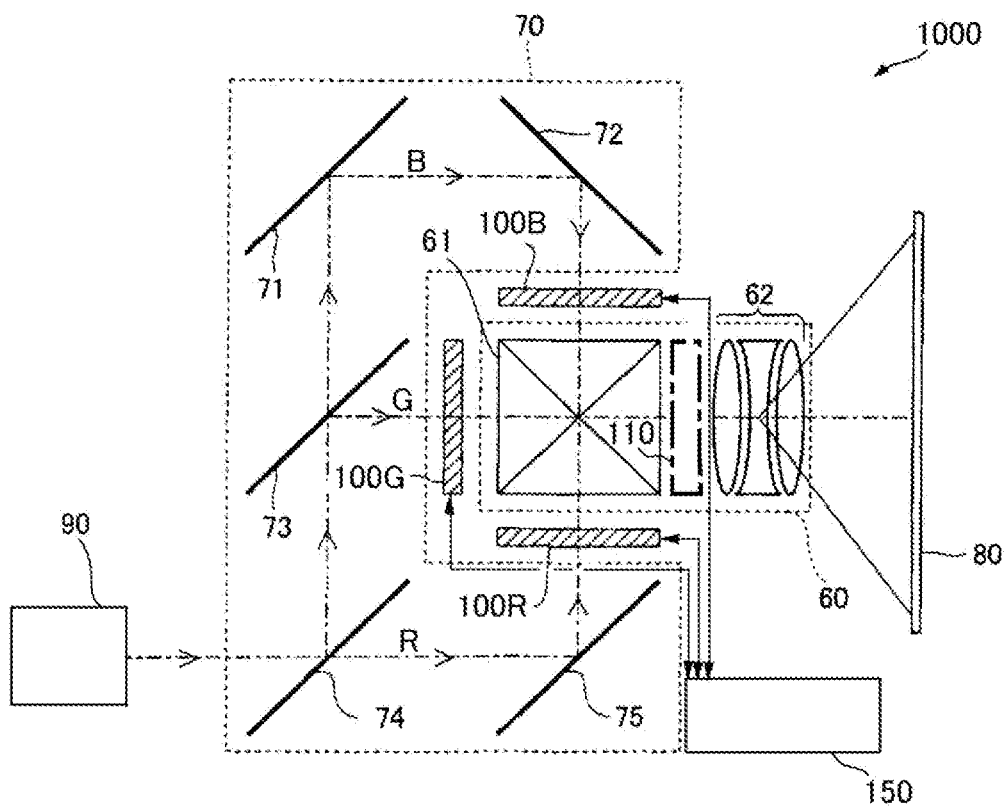
FIG. 18 is a block diagram illustrating an example of a configuration of a projection-type display device to which the present disclosure is applied.
Figure 19:
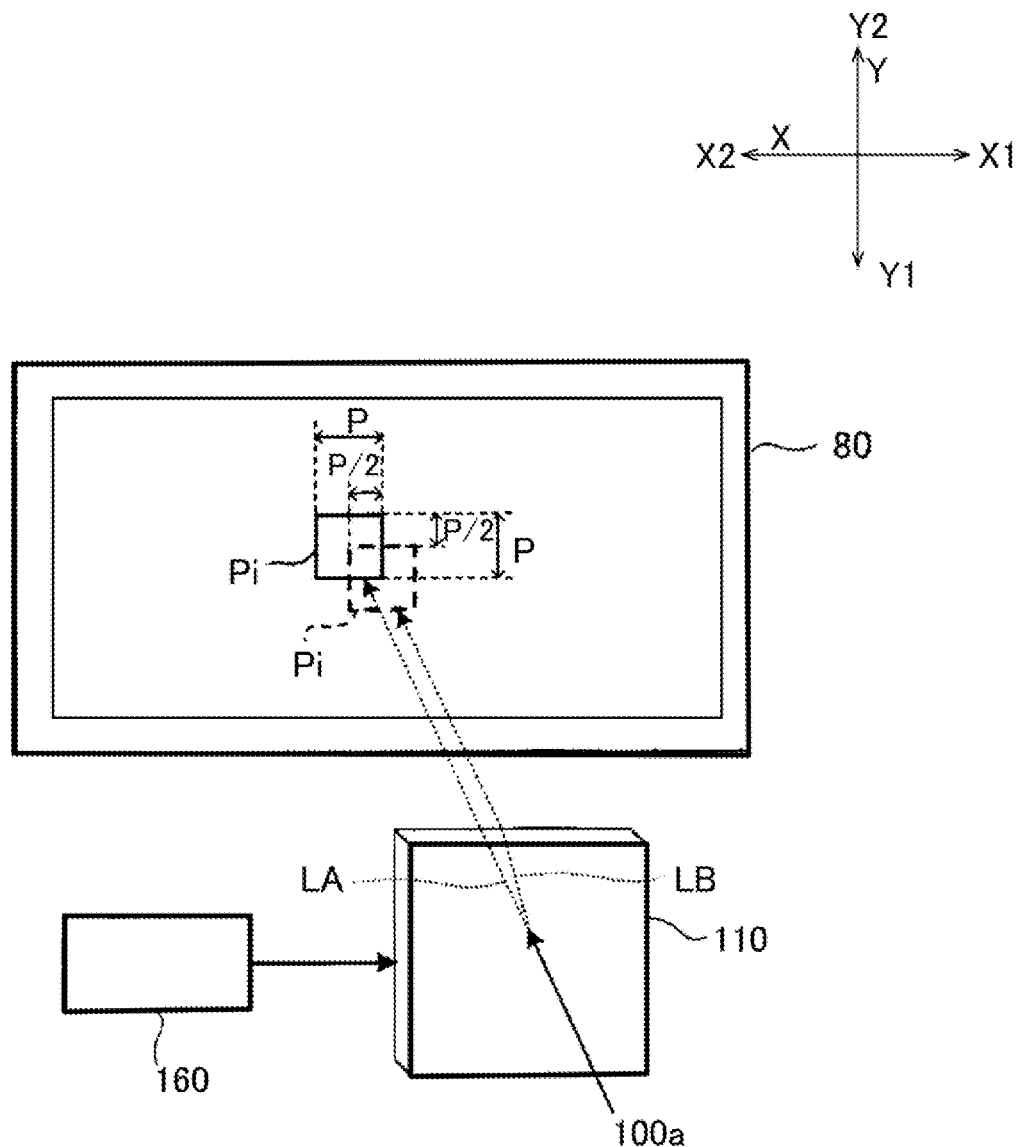
FIG. 19 is an explanatory view illustrating the optical-path shifting element illustrated in FIG. 18.

FIG. 18 is a block diagram illustrating an example of the configuration of a projection-type display device 1000 to which the present disclosure is applied. FIG. 19 is an explanatory view illustrating an optical-path shifting element 110 illustrated in FIG. 18. Note that FIG. 18 does not illustrate a polarizing plate or the like. The projection-type display device 1000 illustrated in FIG. 18 serves as one example of the electronic device to which the present disclosure is applied, and includes an illumination device 90, a separation optical system 70, three electro-optical devices 100R, 100G, and 100B, and a projection optical system 60. Each of the electro-optical devices 100R, 100G, and 100B is comprised of the electro-optical device 100 that has been described with reference to FIGS. 1 to 17.

The illumination device 90 is a white light source, and a laser light source or a halogen lamp is used, for example. The separation optical system 70 includes three mirrors 71, 72, and 75 and dichroic mirrors 73 and 74. The separation optical system 70 separates white light exiting from the illumination device 90 into three primary colors of red R, green G, and blue B. Specifically, the dichroic mirror 74 allows light having a wavelength region of red R to pass through, and reflects light having wavelength regions of green G and blue B. The dichroic mirror 73 allows light having a wavelength region of blue B to pass through, and reflects light having a wavelength regions of green G. Light corresponding to each of red R, green G, and blue B is guided to the electro-optical device 100R, 100G, 100B.

Light modulated by the electro-optical devices 100R, 100G, and 100B enters a dichroic prism 61 from three directions. The dichroic prism 61 constitutes a combining optical system configured to combine images of red R, green G, and blue B. Thus, a projection lens system 62 enlarges and projects the combined image exiting from the optical-path shifting element 110 onto a projection target member such as a screen 80 or the like, thereby being able to display a color image onto the projection target member such as a screen 80 or the like.

At this time, a controller 150 is able to correct an image signal supplied to the electro-optical devices 100R, 100G, and 100B, on the basis of a result of detection of temperatures by the temperature detecting circuit 1. Thus, even when ambient temperatures or the like change, it is possible to display a projection image having high quality.

There is a configuration in which, at a side of the dichroic prism 61 where light exits, an optical-path shifting element 110 indicated by the long dashed short dashed line is provided at a projection optical system 60, and the resolution is enhanced by employing a technique of shifting, for each predetermined period, a position where a projection pixel is visually recognized. In a case of employing this configuration, it is necessary to drive the liquid crystal layer at high speed. Even in such a case, it is possible to drive the electro-optical layer 50 comprised of a liquid crystal layer at high speed by employing a configuration in which an image signal supplied to the electro-optical devices 100R, 100G, and 100B is corrected on the basis of a result of detection of temperatures by the temperature detecting circuit 1, or a configuration in which temperatures of the liquid crystal panel 100p of the electro-optical device 100R, 100G, 100B are adjusted.

The optical-path shifting element 110 is an optical element configured to shift, in a predetermined direction, light exiting from the dichroic prism 61 as illustrated in FIG. 19. FIG. 19 illustrates an example in which light exits from each pixel 100a of the liquid crystal panel 100p, and the position of a projection pixel Pi where the exiting light is visually recognized is shifted by the optical-path shifting element 110 by a distance corresponding to 0.5 pixel pitch (=P/2) in one side X1 of the first direction X and 0.5 pixel pitch (=P/2) in one side Y1 of the second direction Y. The optical-path shifting element 110 includes a transparent plate, and an actuator 160 swings the transparent plate either of or both of around an axial line extending in the first direction X and around an axial line extending in the second direction Y, whereby the optical path of light exiting from each pixel 100a of the liquid crystal panel 100p is shifted into an optical path LA and an optical path LB.

6. OTHER EMBODIMENT

Note that the projection-type display device may include a configuration in which an LED light source or the like configured to emit light of each color is used as a light source unit and the light of each color emitted from the LED light source is supplied to another liquid crystal device.

As for the first capacitance element C1 and the second capacitance element C2 in the first to third embodiments, the destination of electrical connecting of each of the electrodes may be exchanged. For example, in FIG. 15 in the second embodiment, the relay electrode 6e may be electrically connected to the gate wiring line Lg, and the relay electrode 6g may be electrically connected to the cathode wiring line Lc. In addition, the first capacitance element C1 may be configured as a capacitance element having a non-stack structure as in the second embodiment or the third embodiment, and the second capacitance element C2 may be configured as a capacitance element having a stack structure. With such a configuration, it is possible to increase the withstand voltage of the first capacitance element C1 for which detection of a failure is difficult, and when an abnormal voltage is applied, it is possible to detect it as a failure of the transistor Tr. On the other hand, the second capacitance element C2 for which detection of a failure is easy can be set to have a reduced size and can be efficiently arrayed in plan view. This makes it easy to array the electrostatic protection circuit 12 on the electro-optical device 100. By detecting a failure of the transistor Tr or the second capacitance element C2, it is possible to improve the manufacturing step in a rapid manner.

The electronic device including the electro-optical device 100 to which the present disclosure is applied is not limited to the projection-type display device 1000 according to the embodiment described above. For example, the electronic device may be used in an electronic device such as a head-up display (HUD), a head-mounted display (HMD), a personal computer, a digital still camera, and a liquid crystal television.

What is claimed is:

1. An electro-optical device comprising:
a temperature detecting element; and
an electrostatic protection circuit includes:
a transistor including a gate electrode, a semiconductor layer, and a gate insulating film provided between the semiconductor layer and the gate electrode, the transistor being electrically connected in parallel to the temperature detecting element;
a first capacitance element including a first capacitance electrode, a second capacitance electrode, and a first dielectric layer provided between the first capacitance electrode and the second capacitance electrode, the first capacitance element being electrically connected to the transistor; and
a resistance element having one end electrically connected to the gate electrode and the first capacitance electrode and having another end electrically connected to the second capacitance electrode and a source-drain region on one side of the semiconductor layer, wherein
an electrostatic capacity of the first capacitance element is greater than an electrostatic capacity between the gate electrode and the semiconductor layer.

2. The electro-optical device according to claim 1, wherein
a thickness of the first dielectric layer is greater than a thickness of the gate insulating film.

3. The electro-optical device according to claim 1, wherein the first capacitance element includes:
a third capacitance electrode electrically connected to the second capacitance electrode,
a fourth capacitance electrode electrically connected to the first capacitance electrode, and
a second dielectric layer provided between the third capacitance electrode and the fourth capacitance electrode, and
a thickness of the first dielectric layer and a thickness of the second dielectric layer are each greater than a thickness of the gate insulating film.

4. The electro-optical device according to claim 3, wherein
the first capacitance electrode, the second capacitance electrode, the third capacitance electrode, and the fourth capacitance electrode at least partially overlap with each other in plan view.

5. The electro-optical device according to claim 3, wherein
the second capacitance electrode and the third capacitance electrode are formed of an electrically conducting integral film.

6. The electro-optical device according to claim 1, wherein
a thickness of an insulating film provided between the first capacitance electrode and the second capacitance electrode is greater in a peripheral area of the insulating film that overlaps with an end portion of the first capacitance electrode and an end portion of the second capacitance electrode in plan view than in an area, inside the peripheral area, where the first capacitance electrode and the second capacitance electrode overlap in plan view.

7. The electro-optical device according to claim 1, comprising:

a second capacitance element electrically connected in series to the first capacitance element, wherein
the second capacitance element includes:
a fifth capacitance electrode electrically connected to the first capacitance electrode;
a sixth capacitance electrode electrically connected to a source-drain region on another side of the semiconductor layer; and
a third dielectric layer provided between the fifth capacitance electrode and the sixth capacitance electrode.

8. The electro-optical device according to claim 1, wherein
the transistor includes a plurality of unit transistor elements electrically connected in parallel.

9. The electro-optical device according to claim 1, comprising:
a display region in which a plurality of pixels each including a pixel electrode and a retention capacitor are arrayed, wherein
the retention capacitor includes:
a first electrode located at a same layer as the first capacitance electrode;
a second electrode located at a same layer as the second capacitance electrode; and
a dielectric layer located at a same layer as the first dielectric layer.

10. The electro-optical device according to claim 1, comprising:
a plurality of inspecting elements respectively provided at a same layer as the temperature detecting element, the transistor, the resistance element, and the first capacitance element; and
a plurality of inspection terminals electrically connected to the inspecting elements.

11. An electronic device comprising the electro-optical device according to claim 1.

12. An electro-optical device comprising:
a temperature detecting element; and
an electrostatic protection circuit includes:
a transistor including a gate electrode, a semiconductor layer, and a gate insulating film provided between the semiconductor layer and the gate electrode, the transistor being electrically connected in parallel to the temperature detecting element;
a first capacitance element including a first capacitance electrode, a second capacitance electrode, and a first dielectric layer provided between the first capacitance electrode and the second capacitance electrode, the first capacitance element being electrically connected to the transistor; and
a resistance element having one end electrically connected to the gate electrode and the first capacitance electrode and having another end electrically connected to the second capacitance electrode and a source-drain region on one side of the semiconductor layer, wherein
a thickness of the first dielectric layer is greater than a thickness of the gate insulating film.

13. An electro-optical device comprising:
a temperature detecting element;
an electrostatic protection circuit; and
a display region, wherein
the electrostatic protection circuit including:
a transistor including a gate electrode, a semiconductor layer, and a gate insulating film provided between the semiconductor layer and the gate electrode, the transistor being electrically connected in parallel to the temperature detecting element,
a first capacitance element including a first capacitance electrode, a second capacitance electrode, and a first dielectric layer provided between the first capacitance electrode and the second capacitance electrode, the first capacitance element being electrically connected to the transistor, and
a resistance element having one end electrically connected to the gate electrode and the first capacitance electrode and having another end electrically connected to the second capacitance electrode and a source-drain region on one side of the semiconductor layer,
the display region including a plurality of pixels arrayed,
the plurality of pixels each including a retention capacitor and a pixel electrode,
the retention capacitor including:
a first electrode located at a same layer as the first capacitance electrode,
a second electrode located at a same layer as the second capacitance electrode,
a second dielectric layer located at a same layer as the first dielectric layer,
a third electrode electrically connected to the second electrode,
a fourth electrode electrically connected to the first electrode, and
a third dielectric layer provided between the third electrode and the fourth electrode.

* * * * *